(12) United States Patent
Lee et al.

(10) Patent No.: US 12,426,321 B2
(45) Date of Patent: Sep. 23, 2025

(54) TRANSISTOR GATE STRUCTURES AND METHODS OF FORMING THE SAME

(71) Applicant: Taiwan Semiconductor Manufacturing Co., Ltd., Hsinchu (TW)

(72) Inventors: Hsin-Yi Lee, Hsinchu (TW); Ji-Cheng Chen, Hsinchu (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 551 days.

(21) Appl. No.: 17/867,804

(22) Filed: Jul. 19, 2022

(65) Prior Publication Data

US 2023/0343822 A1 Oct. 26, 2023

Related U.S. Application Data

(60) Provisional application No. 63/363,587, filed on Apr. 26, 2022.

(51) Int. Cl.
*H01L 29/76* (2006.01)
*H10D 30/01* (2025.01)
(Continued)

(52) U.S. Cl.
CPC ......... *H10D 62/121* (2025.01); *H10D 30/014* (2025.01); *H10D 30/43* (2025.01); *H10D 30/6757* (2025.01)

(58) Field of Classification Search
CPC .... H10D 62/121; H10D 30/43; H10D 30/014; H10D 30/6757; H10D 30/031; H10D 84/853; H10D 84/0193; H10D 30/024; H10D 30/62; H10D 84/834; H10D 84/0144; H10D 84/83; H10D 84/0158; H10D 86/215; H10D 86/011; H10D 84/0181; H10D 30/701; H10D 62/80; H10D 30/60; H10D 84/0195; H10D 30/6728; H10D 62/235; H10D 62/292; H10D 84/0147; H10D 62/221; H10D 30/021; H10D 30/068; H10D 30/689; H10D 30/66; H10D 84/016; H10D 64/647; H10D 84/851; H01L 21/02603; H01L 21/76843; H01L 21/28568; H01L 21/28079; H01L 21/76877; H01L 21/76831; H01L 21/76802; H01L 21/0214; H01L 23/53295;
(Continued)

(56) References Cited

U.S. PATENT DOCUMENTS

2020/0105533 A1* 4/2020 Chen ................. H10D 84/0177
2021/0082918 A1 3/2021 Cheng et al.
(Continued)

*Primary Examiner* — Niki H Nguyen
(74) *Attorney, Agent, or Firm* — Slater Matsil, LLP

(57) ABSTRACT

In an embodiment, a device includes: a first nanostructure; a gate dielectric layer around the first nanostructure; a first p-type work function tuning layer on the gate dielectric layer; a dielectric barrier layer on the first p-type work function tuning layer; and a second p-type work function tuning layer on the dielectric barrier layer, the dielectric barrier layer being thinner than the first p-type work function tuning layer and the second p-type work function tuning layer.

20 Claims, 26 Drawing Sheets

(51) Int. Cl.
*H10D 30/43* (2025.01)
*H10D 30/67* (2025.01)
*H10D 62/10* (2025.01)

(58) Field of Classification Search
CPC ...... H10B 12/056; H10B 12/36; H10B 20/25; H10B 41/35; H10B 43/20; H10B 51/30; H10B 63/34; H10B 10/00; H10B 20/65; H10B 61/22; H10B 41/41; H10B 43/35; H10B 10/125; H10B 41/27; H10B 43/27; H10B 51/00; H10B 53/30
See application file for complete search history.

(56) References Cited

U.S. PATENT DOCUMENTS

| | | |
|---|---|---|
| 2021/0407861 A1 | 12/2021 | Savant et al. |
| 2021/0407862 A1 | 12/2021 | More et al. |
| 2021/0407995 A1 | 12/2021 | Chiu et al. |
| 2022/0102147 A1 | 3/2022 | Chen et al. |

\* cited by examiner

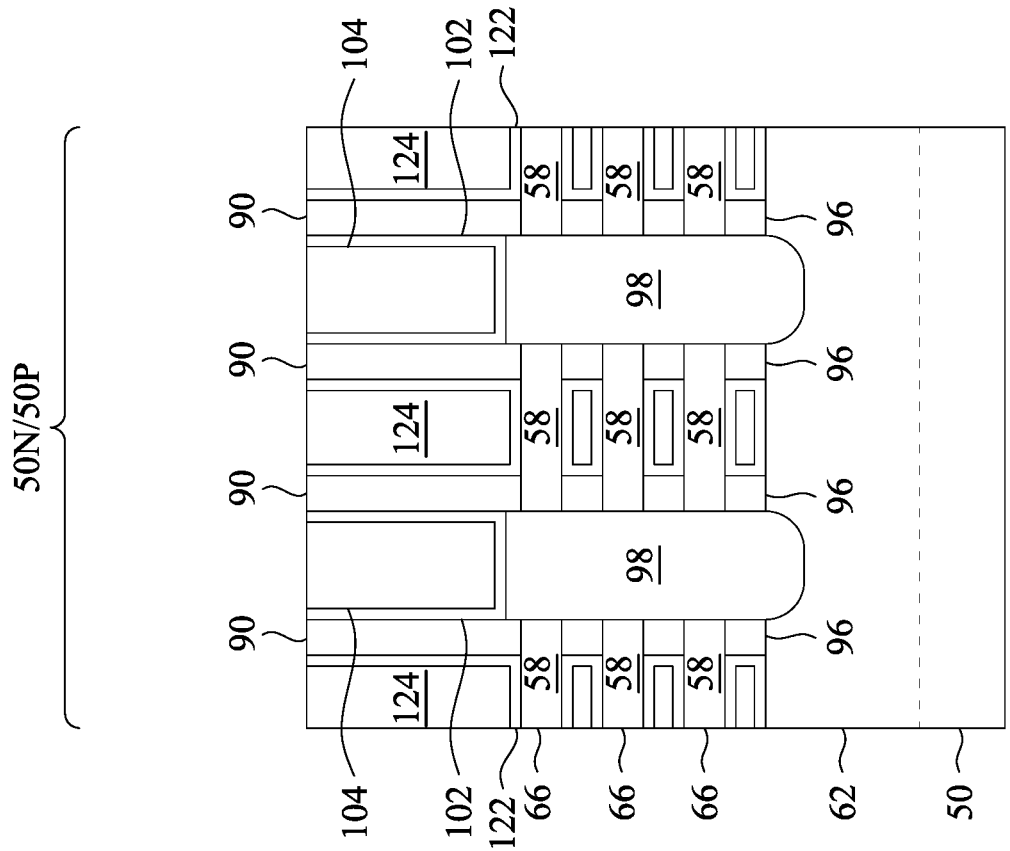
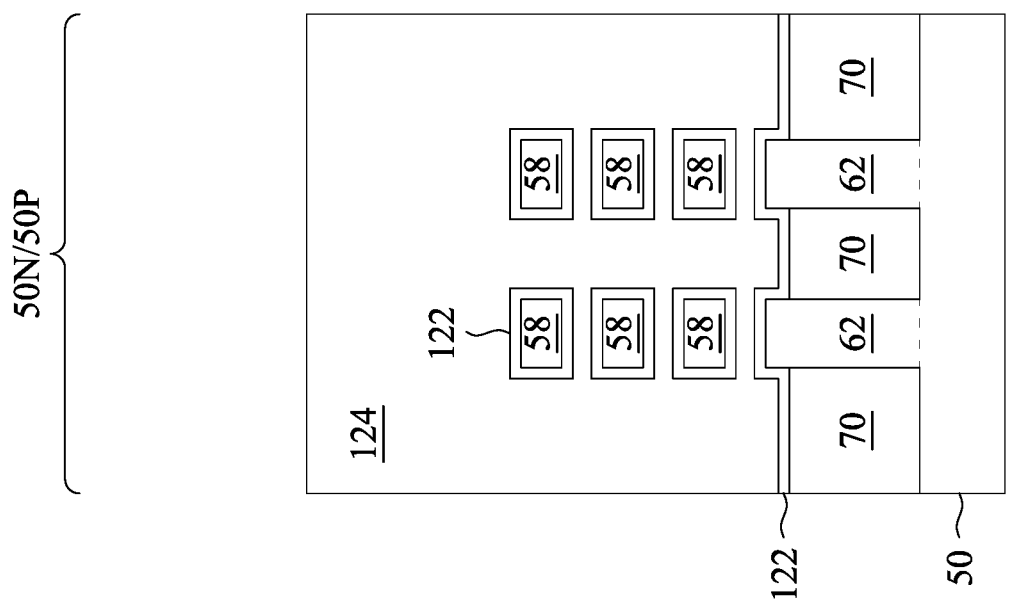
Figure 22B
Figure 22A

TRANSISTOR GATE STRUCTURES AND METHODS OF FORMING THE SAME

PRIORITY CLAIM AND CROSS-REFERENCE

This application claims the benefit of U.S. Provisional Application No. 63/363,587, filed on Apr. 26, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-24B are views of intermediate stages in the manufacturing of nanostructure-FETs, in accordance with some embodiments.

DETAILED DESCRIPTION

Figure 1:
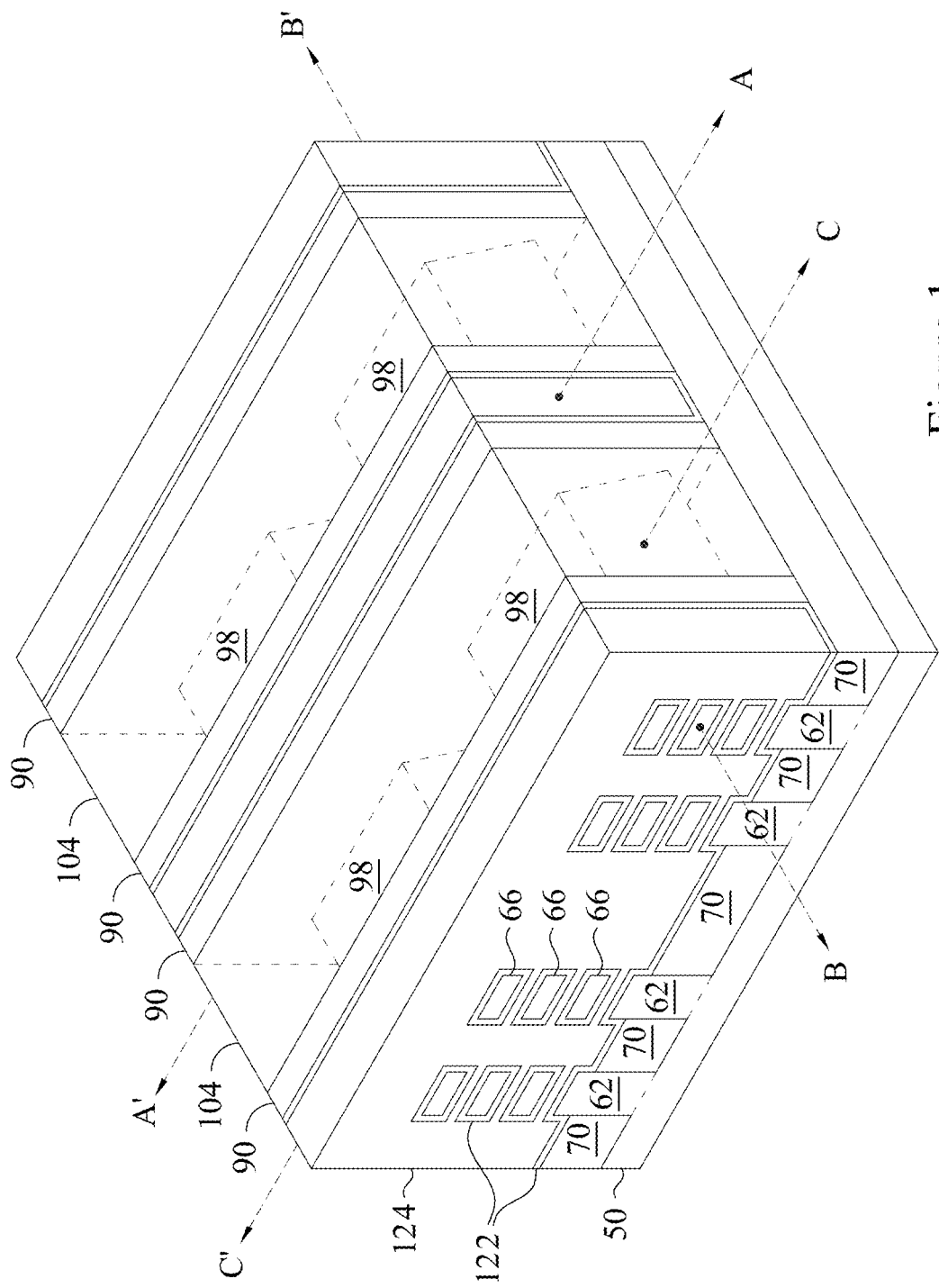
FIG. 1 illustrates an example of a nanostructure field-effect transistor (nanostructure-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a gate electrode layer for p-type devices is formed by forming a protection layer on a work function tuning layer. An annealing process is subsequently performed to modify the work function of an underlying gate dielectric layer. The protection layer protects the underlying work function tuning layer during the annealing process. The protection layer is removed with an oxygen-containing etchant, which promotes formation of a dielectric barrier layer on the work function tuning layer. The dielectric barrier layer may protect the underlying work function tuning layer from modification in subsequent processing. The dielectric barrier layer and work function tuning layer are not removed and remain in the gate electrode layer for the p-type devices. Omitting such a removal process may help avoid damage to the gate dielectric layer in the p-type region, improving performance of the resulting devices.

Embodiments are described in a particular context, a die including nanostructure field-effect transistor (nanostructure-FETs). Various embodiments may be applied, however, to dies including other types of transistors (e.g., fin field-effect transistors (FinFETs), planar transistors, or the like) in lieu of or in combination with the nano structure-FETs.

FIG. 1 illustrates an example of nanostructure-FETs (e.g., nanowire FETs, nanosheet FETs, multi bridge channel (MBC) FETs, nano ribbon FETs, gate-all-around (GAA) FETs, or the like), in accordance with some embodiments. FIG. 1 is a three-dimensional view, where some features of the nanostructure-FETs are omitted for illustration clarity.

The nanostructure-FETs include nanostructures 66 (e.g., nanosheets, nanowires, or the like) over fins 62 on a substrate 50 (e.g., a semiconductor substrate), with the nanostructures 66 being semiconductor features which act as channel regions for the nanostructure-FETs. Isolation regions 70, such as shallow trench isolation (STI) regions, are disposed between adjacent fins 62, which may protrude above and from between neighboring isolation regions 70. The nanostructures 66 are disposed over and between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may comprise a single material or a plurality of materials. In this context, the fins 62 refer to the portion extending between the neighboring isolation regions 70.

Gate dielectrics 122 are over top surfaces of the fins 62 and along top surfaces, sidewalls, and bottom surfaces of the nanostructures 66. Gate electrodes 124 are over the gate dielectrics 122. Epitaxial source/drain regions 98 are disposed on the fins 62 on opposing sides of the gate dielectrics 122 and the gate electrodes 124. Source/drain region(s) may refer to a source or a drain, individually or collectively dependent upon the context. An inter-layer dielectric (ILD) 104 is formed over the epitaxial source/drain regions 98.

Contacts (subsequently described) to the epitaxial source/drain regions 98 will be formed through the ILD 104. The epitaxial source/drain regions 98 may be shared between various nanostructures 66. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 124 and in a direction, for example, perpendicular to the direction of current flow between the epitaxial source/drain regions 98 of a nanostructure-FET. Cross-section B-B' is perpendicular to cross-section A-A' and is parallel to a longitudinal axis of a fin 62 of the nanostructure-FET and in a direction of, for example, a current flow between the epitaxial source/drain regions 98 of the nanostructure-FET. Cross-section C-C' is parallel to cross-section A-A' and extends through epitaxial source/drain regions 98 of the nanostructure-FETs. Subsequent figures refer to these reference cross-sections for clarity.

Some embodiments discussed herein are discussed in the context of nanostructure-FETs formed using a gate-last process. In other embodiments, a gate-first process may be used. Also, some embodiments contemplate aspects used in planar devices, such as planar FETs, or in fin field-effect transistors (FinFETs). For example, FinFETs may include semiconductor fins on a substrate, with the semiconductor fins being semiconductor features which act as channel regions for the FinFETs. Similarly, planar FETs may include a substrate, with planar portions of the substrate being semiconductor features which act as channel regions for the planar FETs.

FIGS. 2-24B are views of intermediate stages in the manufacturing of nanostructure-FETs, in accordance with some embodiments. FIGS. 2, 3, 4, 5, 6, and 7 are three-dimensional views showing a similar three-dimensional view as FIG. 1. FIGS. 8A, 9A, 10A, 11A, 12A, 13A, 14A, 15A, 16A, 17A, 18A, 19A, 20A, 21A, 22A, 23A, and 24A are cross-sectional views illustrated along a similar cross-section as reference cross-section A-A' in FIG. 1. FIGS. 8B, 9B, 10B, 11B, 12B, 13B, 14B, 15B, 16B, 17B, 18B, 19B, 20B, 21B, 22B, 23B, and 24B are cross-sectional views illustrated along a similar cross-section as reference cross-section B-B' in FIG. 1. FIGS. 10C and 10D are cross-sectional views illustrated along a similar cross-section as reference cross-section C-C' in FIG. 1.

Figure 2:
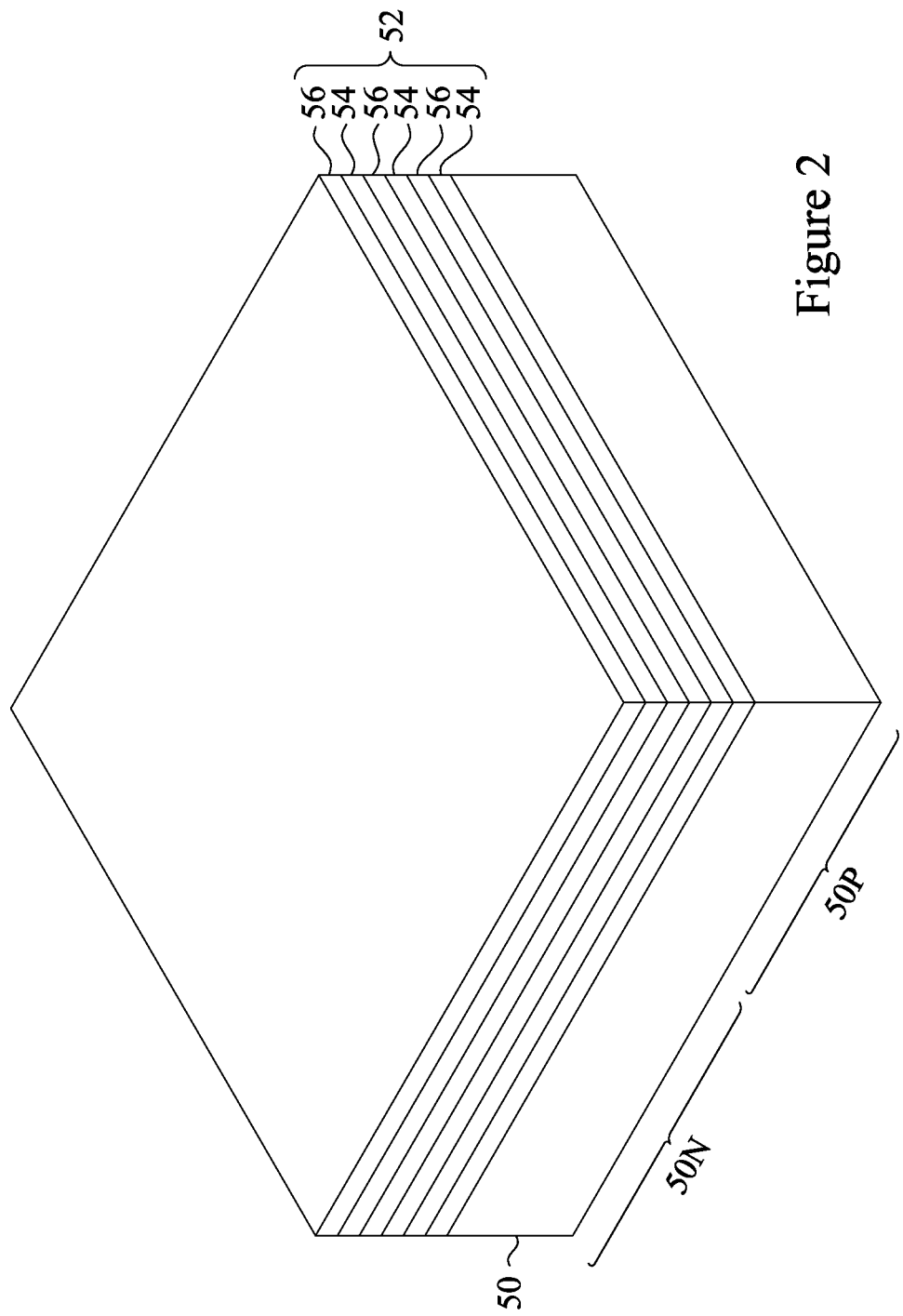

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure-FETs, and the p-type region 50P can be for forming p-type devices, such as PMOS transistors, e.g., p-type nanostructure-FETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50.

In the illustrated embodiment, and as will be subsequently described in greater detail, the first semiconductor layers 54 will be removed and the second semiconductor layers 56 will patterned to form channel regions for the nanostructure-FETs in both the n-type region 50N and the p-type region 50P. In such embodiments, the channel regions in both the n-type region 50N and the p-type region 50P may have a same material composition (e.g., silicon or another semiconductor material) and be formed simultaneously. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nanostructure-FETs in one region (e.g., the p-type region 50P), and the second semiconductor layers 56 will be patterned to form channel regions for nanostructure-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without significantly removing the second semiconductor layers 56 in the n-type region 50N, and the second semiconductor layers 56 may be removed without significantly removing the first semiconductor layers 54 in the p-type region 50P.

The multi-layer stack 52 is illustrated as including three layers of each of the first semiconductor layers 54 and the second semiconductor layers 56. It should be appreciated that the multi-layer stack 52 may include any number of the first semiconductor layers 54 and the second semiconductor layers 56. Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. In some embodiments, some layers of the multi-layer stack 52 (e.g., the second semiconductor layers 56) are formed to be thinner than other layers of the multi-layer stack 52 (e.g., the first semiconductor layers 54).

Figure 3:
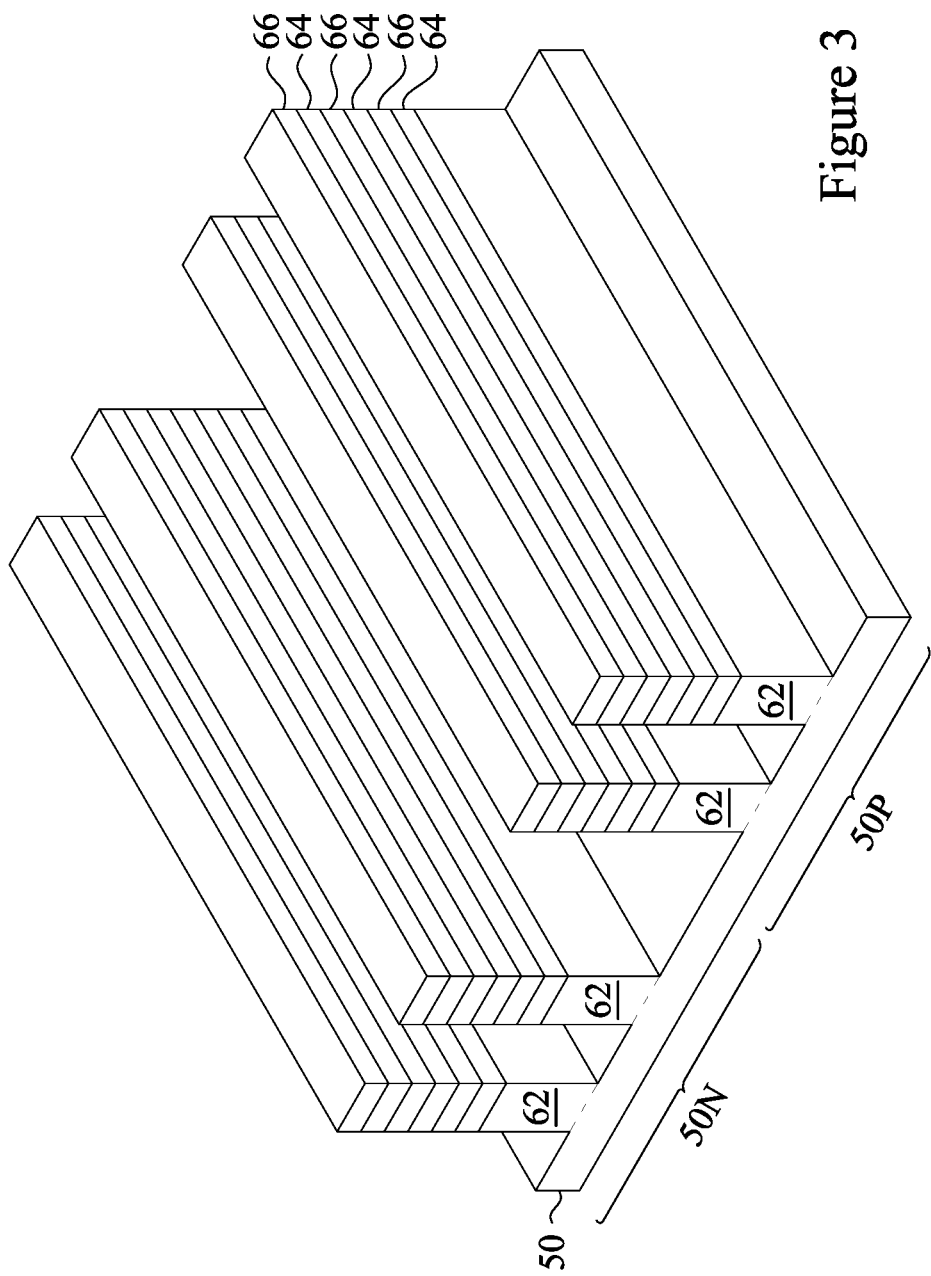

In FIG. 3, fins 62 are formed in the substrate 50 and nanostructures 64, 66 are formed in the multi-layer stack 52. In some embodiments, the nanostructures 64, 66 and the fins 62 may be formed in the multi-layer stack 52 and the substrate 50, respectively, by etching trenches in the multi-layer stack 52 and the substrate 50. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may further define first nanostructures 64 from the first semiconductor layers 54 and define second nanostructures 66 from the second semiconductor layers 56.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 62.

The fins 62 are illustrated as having substantially equal widths in both the n-type region 50N and the p-type region 50P. In some embodiments, the widths of the fins 62 in the n-type region 50N may be greater or less than the width of the fins 62 in the p-type region 50P. Further, while each of the fins 62 and the nanostructures 64, 66 are illustrated as having a consistent width throughout, in other embodiments, the fins 62 and/or the nanostructures 64, 66 may have tapered sidewalls such that a width of each of the fins 62 and/or the nanostructures 64, 66 continuously increases in a direction towards the substrate 50. In such embodiments, each of the nanostructures 64, 66 may have a different width and be trapezoidal in shape.

Figure 4:
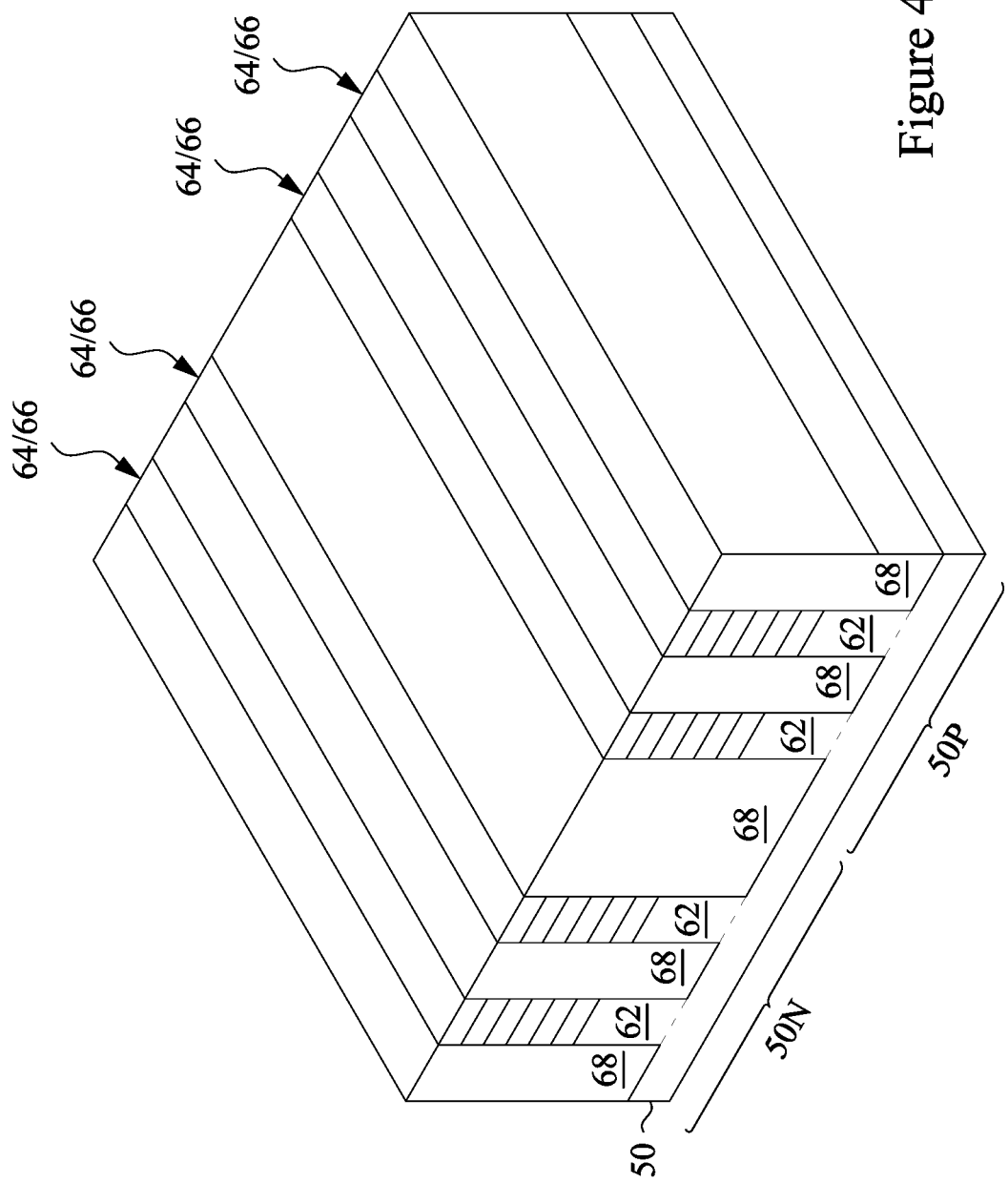

In FIG. 4, an insulation material 68 is deposited over the substrate 50, the fins 62, and nanostructures 64, 66, and between adjacent fins 62. The insulation material 68 may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In some embodiments, the insulation material 68 is silicon oxide formed by an FCVD process. An annealing process may be performed once the insulation material 68 is formed. In an embodiment, the insulation material 68 is formed such that excess insulation material 68 covers the nanostructures 64, 66.

Although the insulation material 68 is illustrated as a single layer, some embodiments may utilize multiple layers. For example, in some embodiments a liner (not separately illustrated) may first be formed along a surface of the substrate 50, the fins 62, and the nanostructures 64, 66. Thereafter, a fill material, such as one of the previously described insulation materials may be formed over the liner.

A removal process is then applied to the insulation material 68 to remove excess insulation material 68 over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulation material 68 are level after the planarization process is complete.

Figure 5:
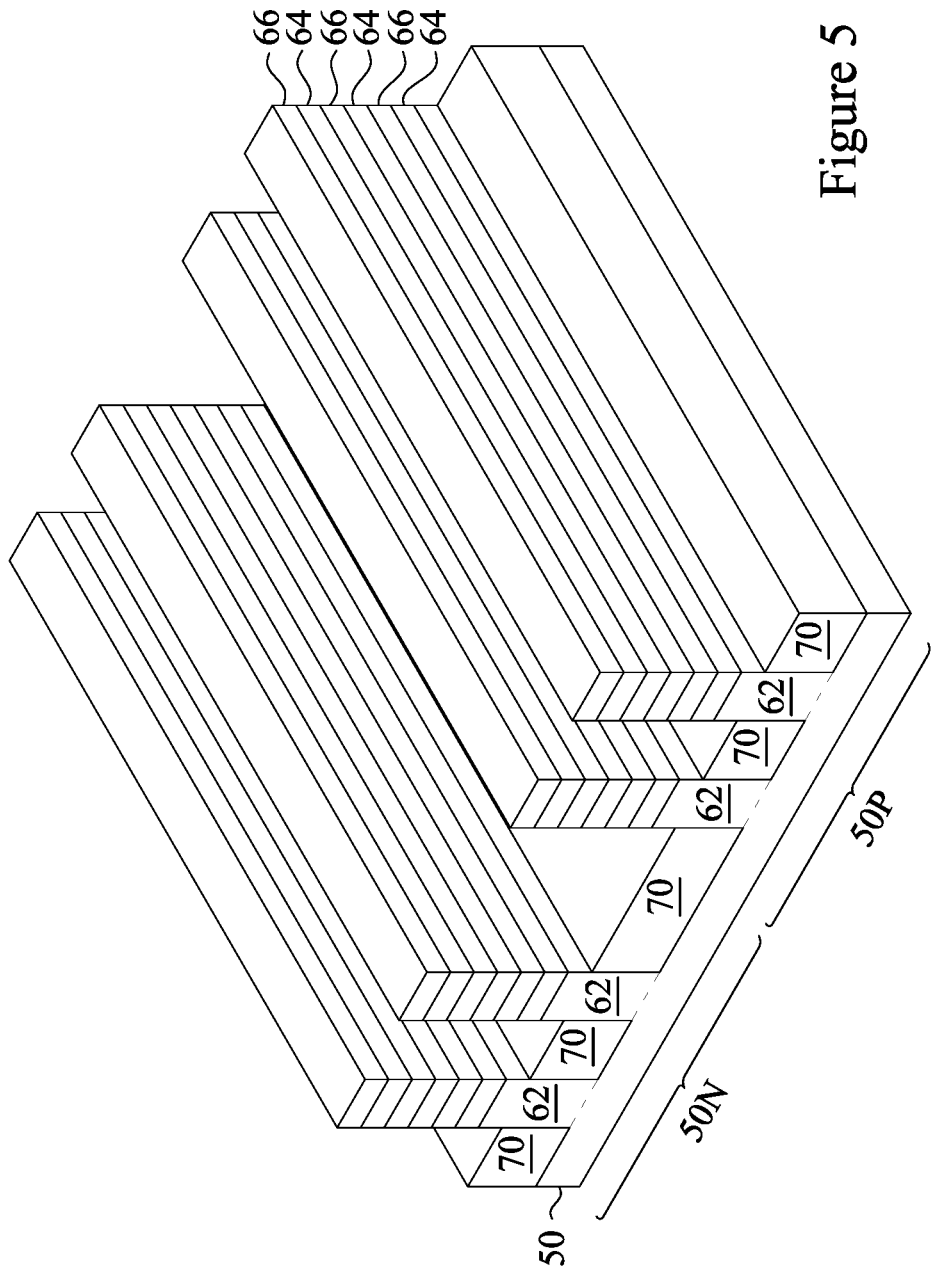

In FIG. 5, the insulation material 68 is recessed to form STI regions 70. The STI regions 70 are adjacent the fins 62. The insulation material 68 is recessed such that upper portions of fins 62 protrude from between neighboring STI regions 70. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The STI regions 70 may be recessed using an acceptable etching process, such as one that is selective to the material of the insulation material 68 (e.g., etches the material of the insulation material 68 at a faster rate than the materials of the fins 62 and the nanostructures 64, 66). For example, an oxide removal using, for example, dilute hydrofluoric (dHF) acid may be used.

The previously described process is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may comprise the previously described alternating semiconductor materials, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the fins 62, the nanostructures 64, 66, and/or the STI regions 70. In embodiments with different well types, different implant steps for the n-type region 50N and the p-type region 50P may be achieved using a photoresist or other mask (not separately illustrated). For example, a photoresist may be formed over the fins 62, the nanostructures 64, 66, and the STI regions 70 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from $10^{13}$ atoms/cm$^3$ to $10^{14}$ atoms/cm$^3$. After the implant, the photoresist is removed, such as by an acceptable ashing process.

Following or prior to the implanting of the p-type region 50P, a photoresist or other mask (not separately illustrated) is formed over the fins 62, the nanostructures 64, 66, and the STI regions 70 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from $10^{13}$ atoms/cm$^3$ to $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 6:
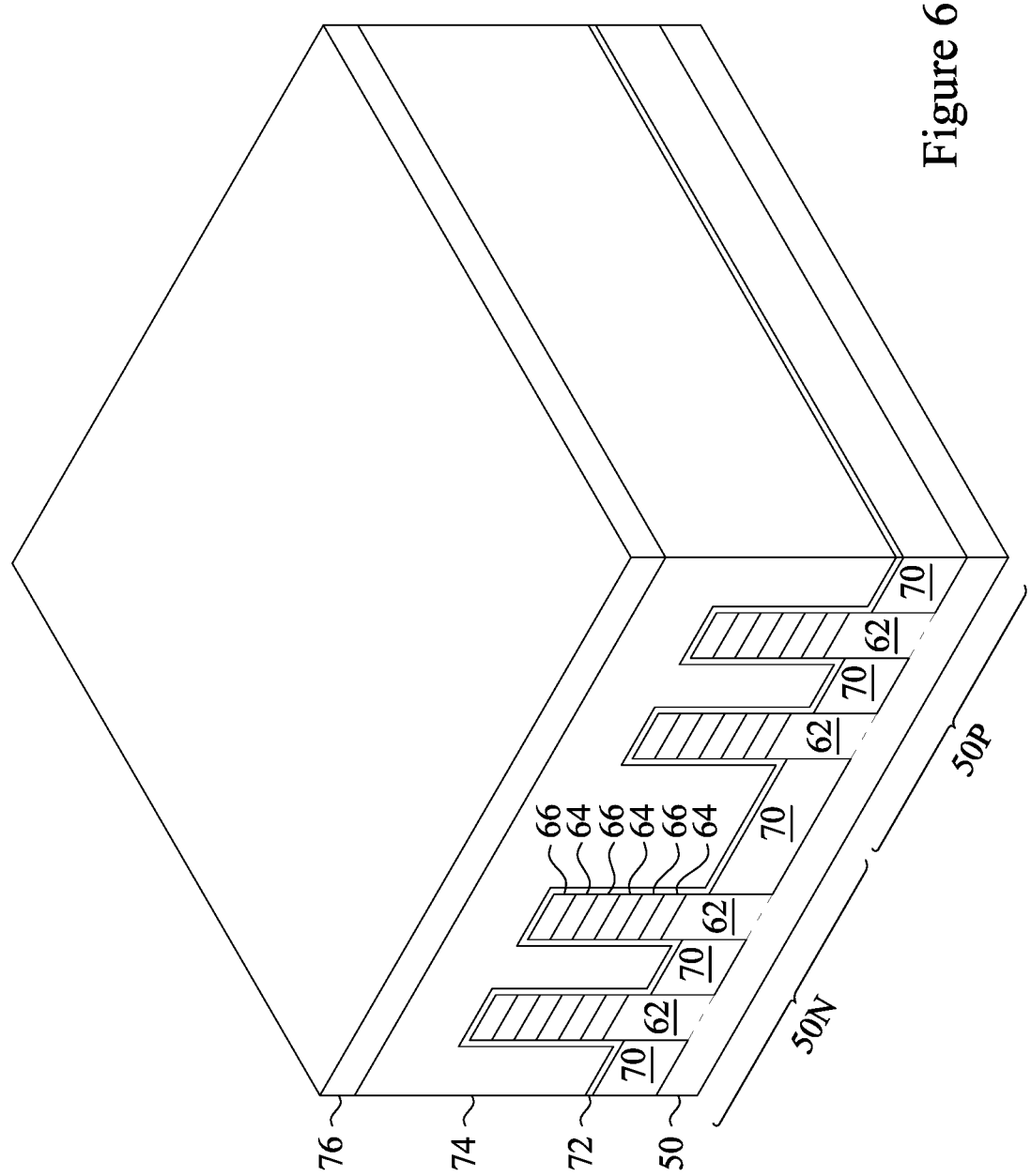

In FIG. 6, a dummy dielectric layer 72 is formed on the fins 62 and/or the nanostructures 64, 66. The dummy dielectric layer 72 may be formed of silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The material of the dummy gate layer 74 may be deposited by CVD, physical vapor deposition (PVD), sputter deposition, or other techniques for depositing the selected material. The dummy gate layer 74 may be made of other materials that have a high etching selectivity from the etching of insulation materials, e.g., the STI regions 70 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the STI regions 70, such that the dummy dielectric layer 72 extends between the dummy gate layer 74 and the STI regions 70. In another embodiment, the dummy dielectric layer 72 covers only the fins 62 and the nanostructures 64, 66.

Figure 7:
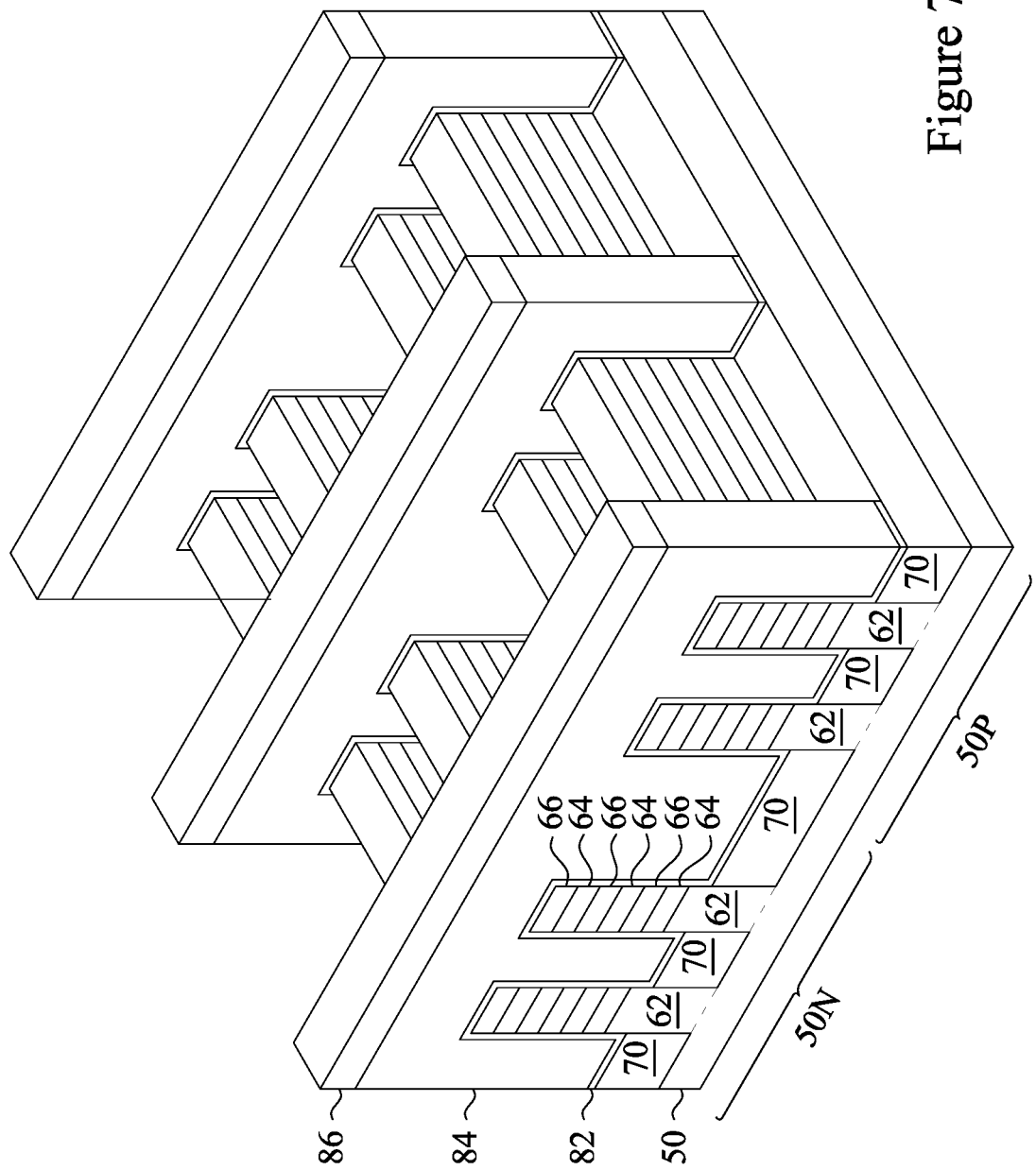

In FIG. 7, the mask layer 76 is patterned using acceptable photolithography and etching techniques to form masks 86. The pattern of the masks 86 then may be transferred to the dummy gate layer 74 and to the dummy dielectric layer 72 to form dummy gates 84 and dummy dielectrics 82, respectively. The dummy gates 84 cover respective channel regions 58 (see FIGS. 8A-8B) of the fins 62. The pattern of the masks 86 may be used to physically separate each of the dummy gates 84 from adjacent dummy gates 84. The dummy gates 84 may also have a lengthwise direction substantially perpendicular to the lengthwise direction of respective fins 62. The masks 86 can optionally be removed after patterning, such as by any acceptable etching technique.

FIGS. 8A-24B illustrate various additional steps in the manufacturing of embodiment devices. FIGS. 8A-24B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description of each figure.

Figure 8B:
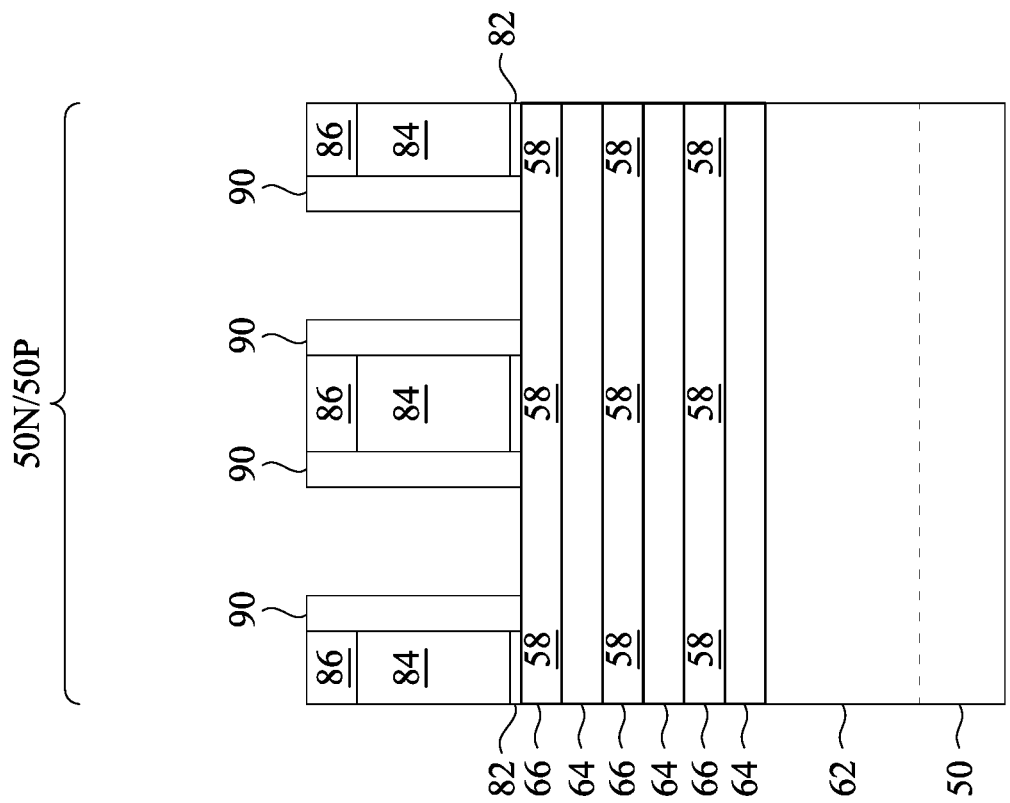
Figure 8A:
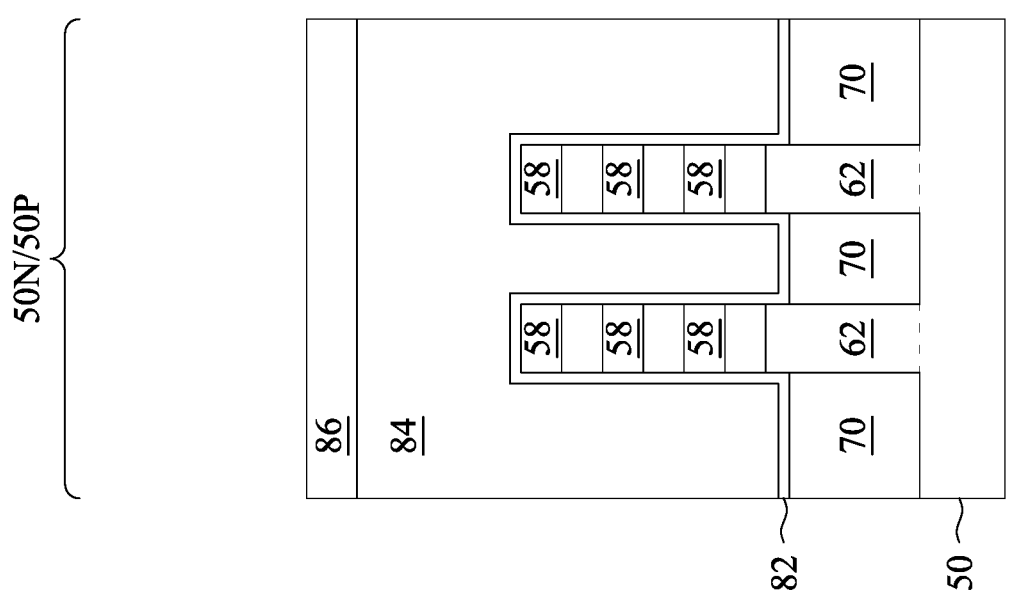

In FIGS. 8A-8B, gate spacers 90 are formed over the nanostructures 64, 66, on exposed sidewalls of the masks 86 (if present), the dummy gates 84, and the dummy dielectrics 82. The gate spacers 90 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). As will be subsequently described in greater detail, the dielectric material(s), when etched, may also have portions left on the sidewalls of the fins 62 and/or the nanostructures 64, 66 (thus forming fin spacers 92, see FIGS. 10C-10D). After etching, the fin spacers 92 and/or the gate spacers 90 can have straight sidewalls (as illustrated) or can have curved sidewalls (not separately illustrated).

Further, implants for lightly doped source/drain (LDD) regions (not separately illustrated) may be performed. In embodiments with different device types, similar to the implants for the previously described wells, a mask, such as a photoresist, may be formed over the n-type region 50N, while exposing the p-type region 50P, and appropriate type (e.g., p-type) impurities may be implanted into the fins 62 and the nanostructures 64, 66 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the fins 62 and the nanostructures 64, 66 exposed in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from $10^{15}$ atoms/cm$^3$ to $10^{19}$ atoms/cm$^3$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 9B:
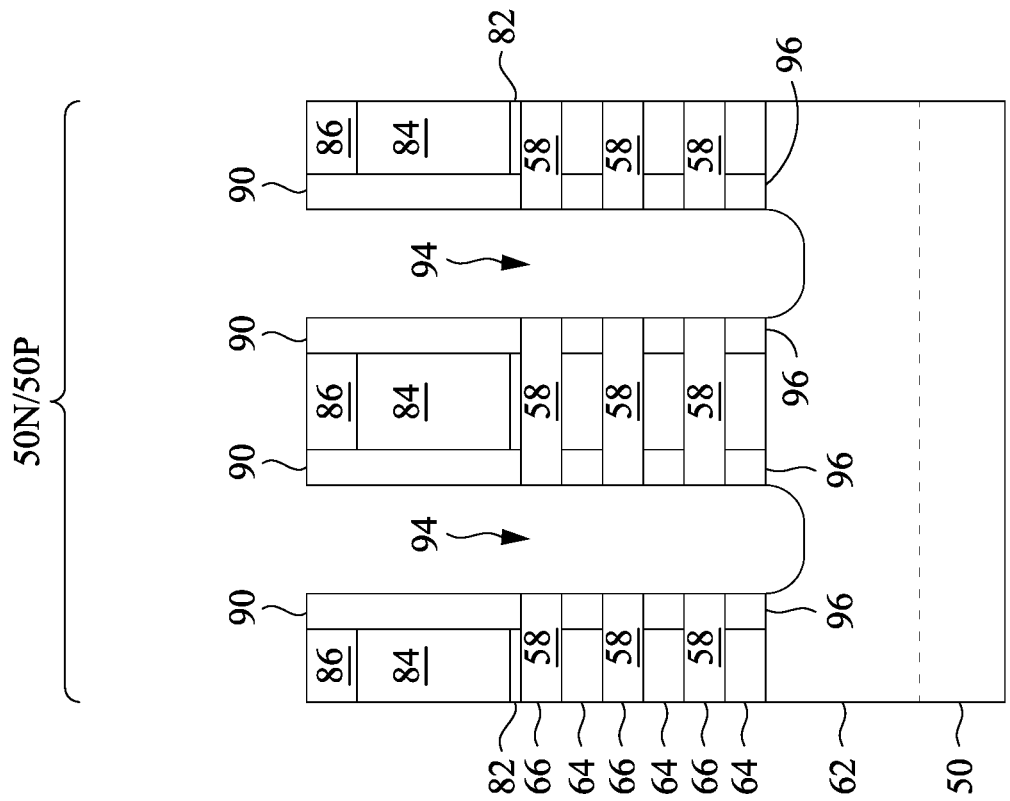
Figure 9A:
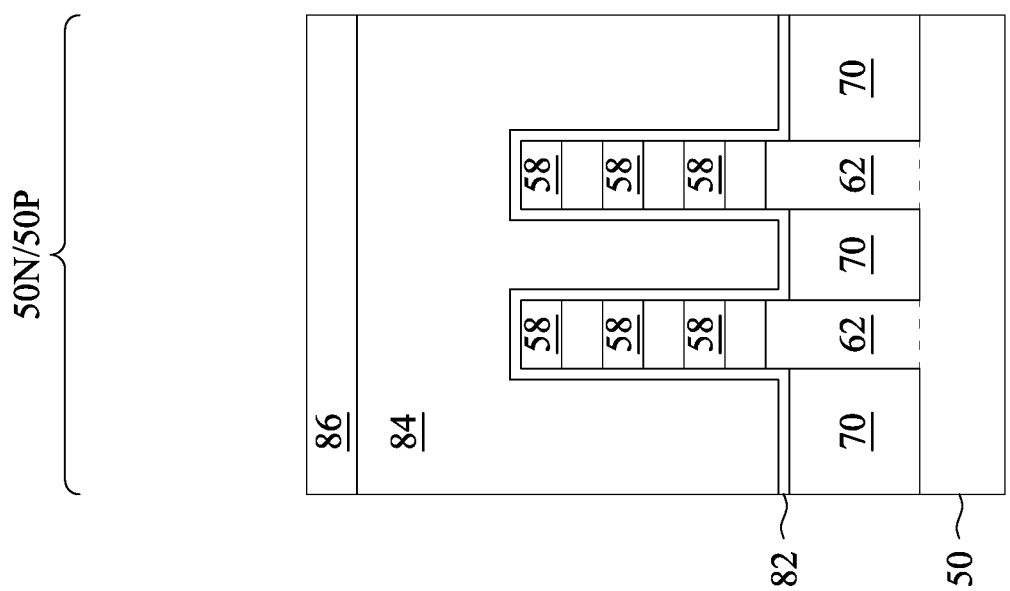
Figure 10B:
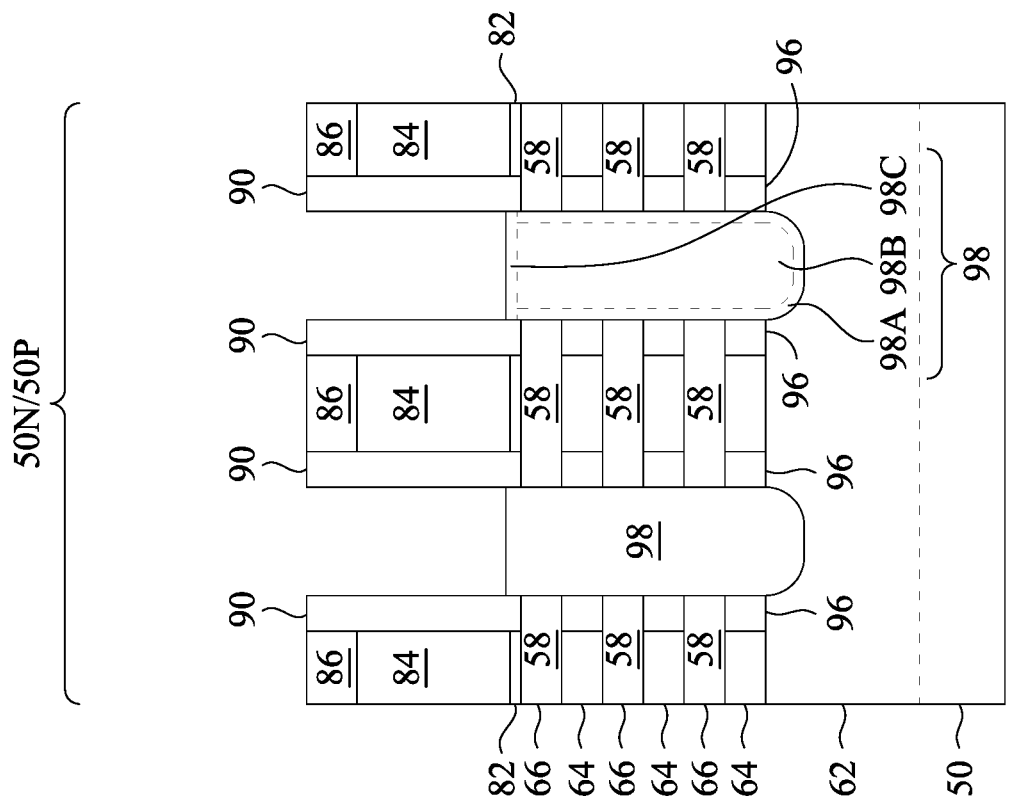
Figure 10A:
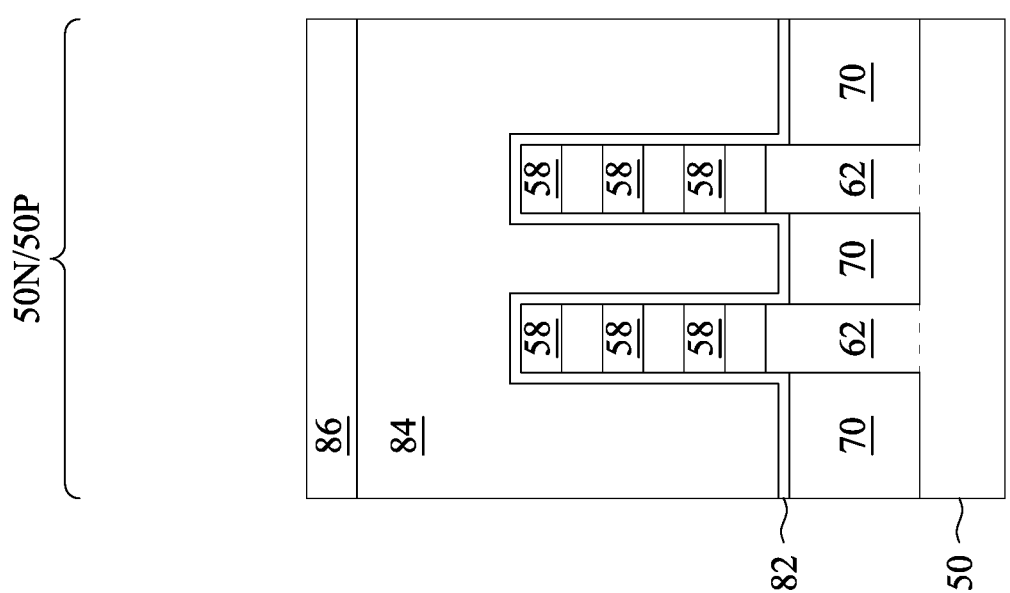
Figure 10C:
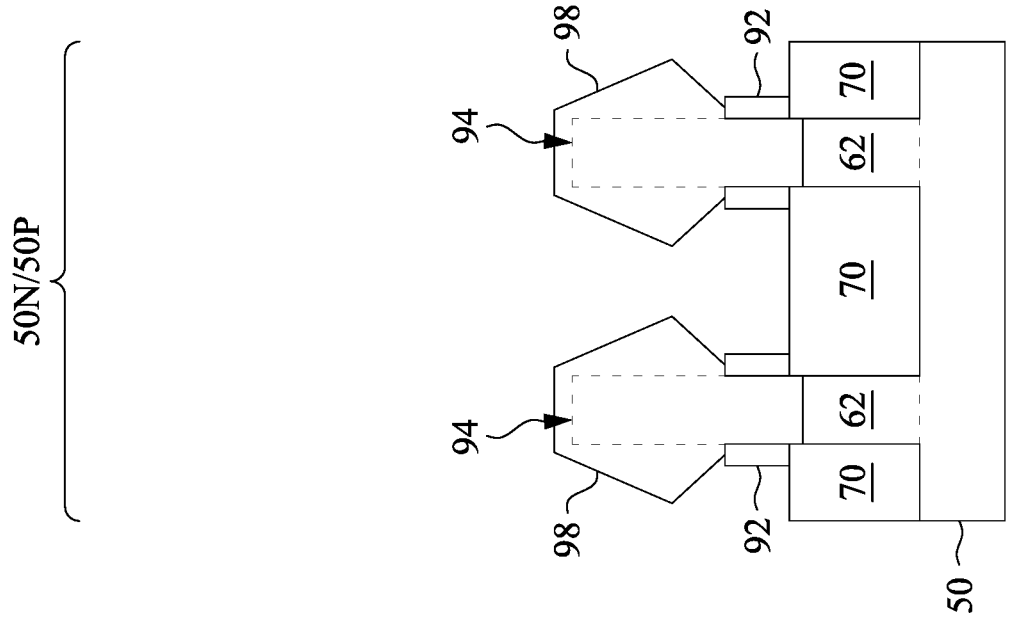
Figure 10D:
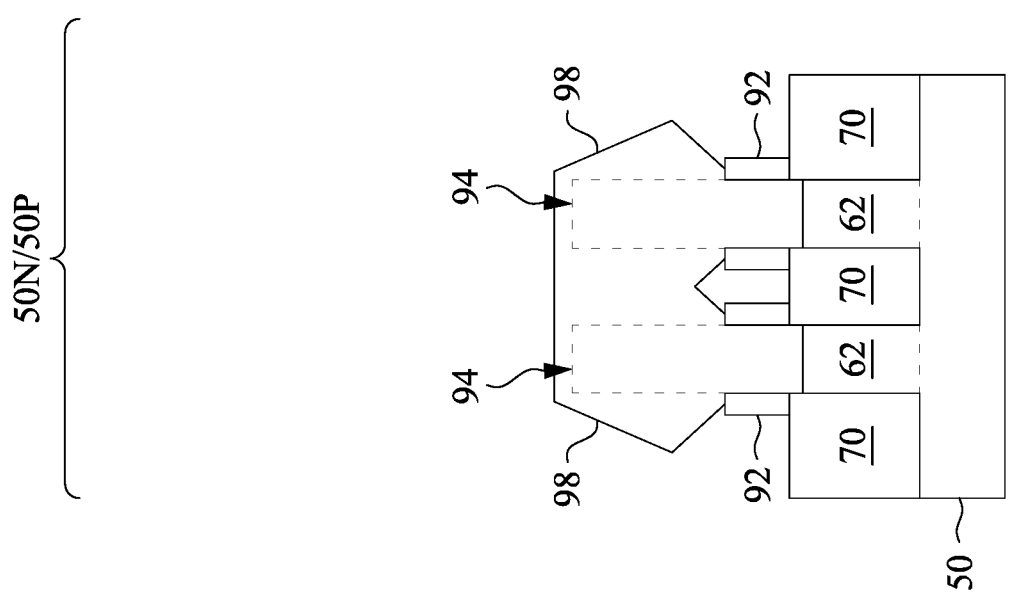

In FIGS. 9A-9B, source/drain recesses 94 are formed in the fins 62, the nanostructures 64, 66, and the substrate 50. Epitaxial source/drain regions will be subsequently formed in the source/drain recesses 94. The source/drain recesses 94 may extend through the nanostructures 64, 66 and into the substrate 50. In some embodiments, the fins 62 may be etched such that bottom surfaces of the source/drain recesses 94 are disposed below the top surfaces of the STI regions 70. The source/drain recesses 94 may be formed by etching the fins 62, the nanostructures 64, 66, and the substrate 50 using anisotropic etching processes, such as RIE, NBE, or the like. The gate spacers 90 and the dummy gates 84 mask portions of the fins 62, the nanostructures 64, 66, and the substrate 50 during the etching processes used to form the source/drain recesses 94. A single etch process or multiple etch processes may be used to etch each layer of the nanostructures 64, 66 and/or the fins 62. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to prevent damage to the subsequently formed source/drain regions by subsequent etch processes, such as etch processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed to form sidewall recesses. Although sidewalls of the first nanostructures 64 are illustrated as being straight, the sidewalls may be concave or convex. The sidewalls may be recessed by any acceptable etch process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etch process may be a wet etch using tetramethylammonium hydroxide (TMAH), ammonium hydroxide (NH$_4$OH), or the like. In another embodiment, the etch process may be a dry etch using a fluorine-based gas such as hydrogen fluoride (HF) gas. In some embodiments, the same etch process may be continually performed to both form the source/drain recesses 94 and recess the sidewalls of the first nanostructures 64. The inner spacers 96 can then be formed by conformally forming an insulating material in the source/drain recesses 94, and subsequently etching the insulating material. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like.

Although outer sidewalls of inner spacers 96 are illustrated as being flush with sidewalls of the second nanostructures 66, the outer sidewalls of the inner spacers 96 may extend beyond or be recessed from sidewalls of the second nanostructures 66. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

In FIGS. 10A-10D, epitaxial source/drain regions 98 are formed in the source/drain recesses 94. In some embodiments, the epitaxial source/drain regions 98 exert stress in the respective channel regions 58, thereby improving performance. The epitaxial source/drain regions 98 are formed in the source/drain recesses 94 such that each dummy gate 84 is disposed between respective neighboring pairs of the epitaxial source/drain regions 98. In some embodiments, the gate spacers 90 are used to separate the epitaxial source/drain regions 98 from the dummy gates 84 and the inner spacers 96 are used to separate the epitaxial source/drain regions 98 from the nanostructures 64 by an appropriate lateral distance so that the epitaxial source/drain regions 98 do not short out with subsequently formed gates of the resulting nanostructure-FETs.

The epitaxial source/drain regions 98 in the n-type region 50N may be formed by masking the p-type region 50P. Then, the epitaxial source/drain regions 98 are epitaxially grown in the source/drain recesses 94 in the n-type region 50N. The epitaxial source/drain regions 98 may include any acceptable material appropriate for n-type nanostructure-FETs. For example, if the second nanostructures 66 are formed of silicon, the epitaxial source/drain regions 98 may include materials exerting a tensile strain on the second nanostructures 66, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 may have surfaces raised from respective upper surfaces of the nanostructures 64, 66 and may have facets.

The epitaxial source/drain regions 98 in the p-type region 50P may be formed by masking the n-type region 50N. Then, the epitaxial source/drain regions 98 are epitaxially grown in the source/drain recesses 94 in the p-type region 50P. The epitaxial source/drain regions 98 may include any acceptable material appropriate for p-type nanostructure-FETs. For example, if the second nanostructures 66 are formed of silicon, the epitaxial source/drain regions 98 may comprise materials exerting a compressive strain on the first nanostructures 64, such as silicon-germanium, boron doped silicon-germanium, germanium, germanium tin, or the like. The epitaxial source/drain regions 98 in the p-type region 50P may be referred to as "p-type source/drain regions." The epitaxial source/drain regions 98 may also have surfaces raised from respective surfaces of the nanostructures 64, 66 and may have facets.

The epitaxial source/drain regions 98, the nanostructures 64, 66, and/or the fins 62 may be implanted with dopants to form source/drain regions, similar to the process previously discussed for forming lightly-doped source/drain regions, followed by an anneal. The source/drain regions may have an impurity concentration of between $10^{19}$ atoms/cm$^3$ and $10^{21}$ atoms/cm$^3$. The n-type and/or p-type impurities for source/drain regions may be any of the impurities previously discussed. In some embodiments, the epitaxial source/drain regions 98 may be in situ doped during growth.

As a result of the epitaxy processes used to form the epitaxial source/drain regions 98, upper surfaces of the epitaxial source/drain regions 98 have facets which expand laterally outward beyond sidewalls of the nanostructures 64, 66. In some embodiments, these facets cause adjacent epitaxial source/drain regions 98 of a same nanostructure-FET to merge as illustrated by FIG. 10C. In other embodiments, adjacent epitaxial source/drain regions 98 remain separated after the epitaxy process is completed as illustrated by FIG. 10D. In the illustrated embodiments, the fin spacers 92 are formed on a top surface of the STI regions 70, thereby blocking the epitaxial growth. In some other embodiments, the fin spacers 92 may cover portions of the sidewalls of the nanostructures 64, 66 and/or the fins 62, further blocking the epitaxial growth. In another embodiment, the spacer etch used to form the gate spacers 90 is adjusted to not form fin spacers, so as to allow the epitaxial source/drain regions 98 to extend to the surface of the STI region 70.

The epitaxial source/drain regions 98 may comprise one or more semiconductor material layers. For example, the epitaxial source/drain regions 98 may comprise a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different dopant concentrations. In some embodiments, the liner layer 98A may have a dopant concentration less than the main layer 98B and greater than the finishing layer 98C. In embodiments in which the epitaxial source/drain regions 98 comprise three semiconductor material layers, the liner layer 98A may be deposited, the main layer 98B may be deposited over the liner layer 98A, and the finishing layer 98C may be deposited over the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 11B:
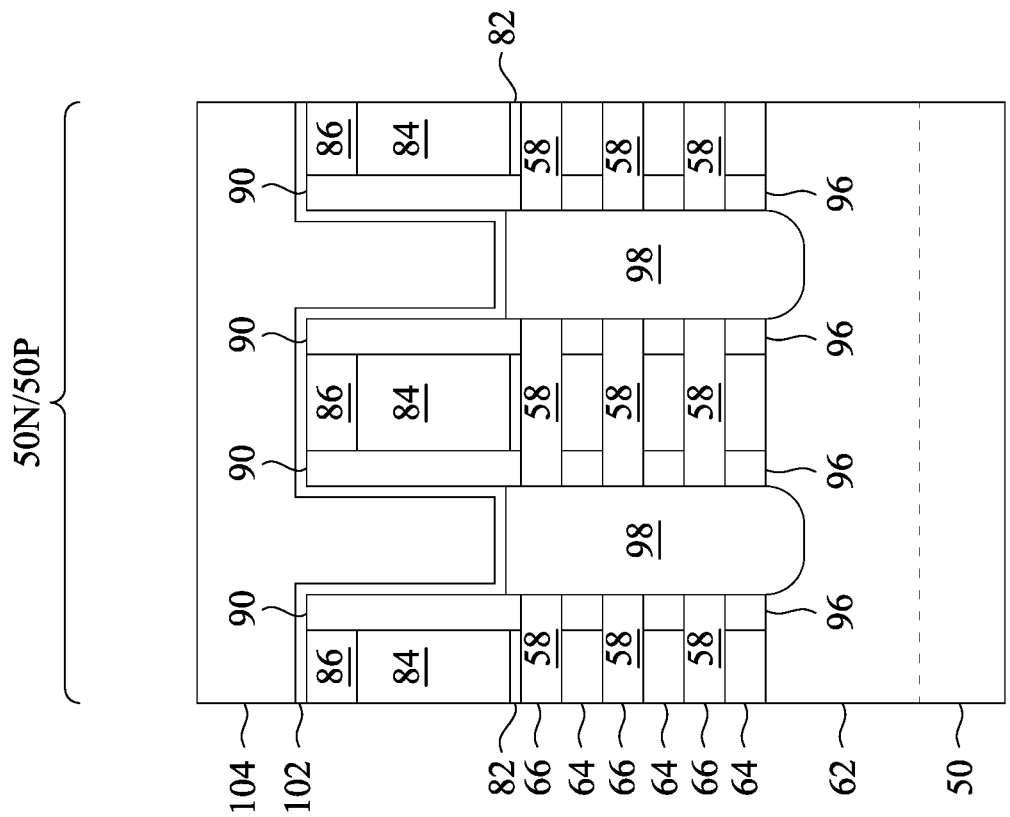
Figure 11A:
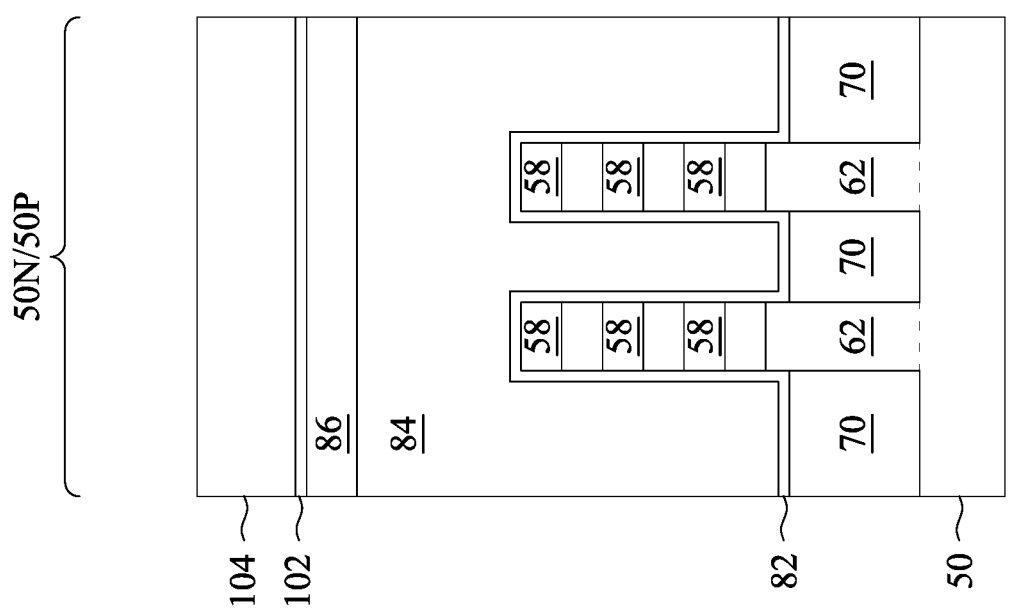

In FIGS. 11A-11B, a first ILD 104 is deposited over the epitaxial source/drain regions 98, the gate spacers 90, and the masks 86 (if present) or the dummy gates 84. The first ILD 104 may be formed of a dielectric material, which may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material having a high etching selectivity from the etching of the first ILD 104, such as, silicon nitride, silicon oxide, silicon oxynitride, or the like, which may be formed by any suitable deposition process, such as CVD, ALD, or the like.

Figure 12B:
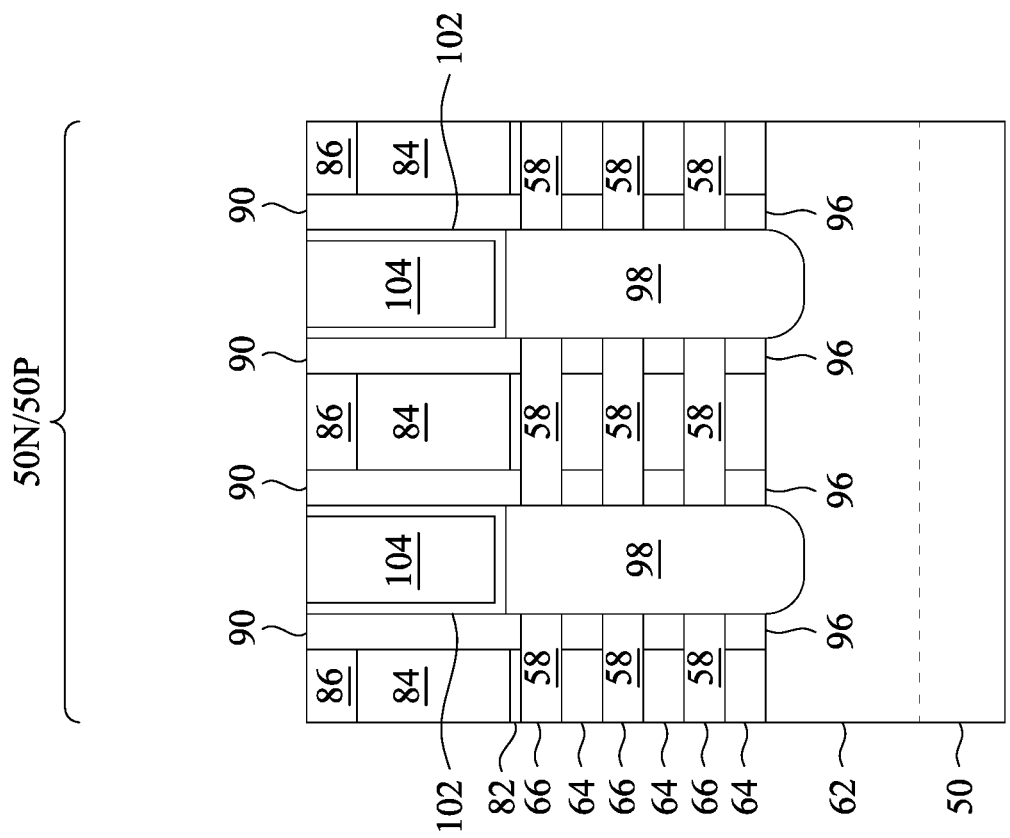
Figure 12A:
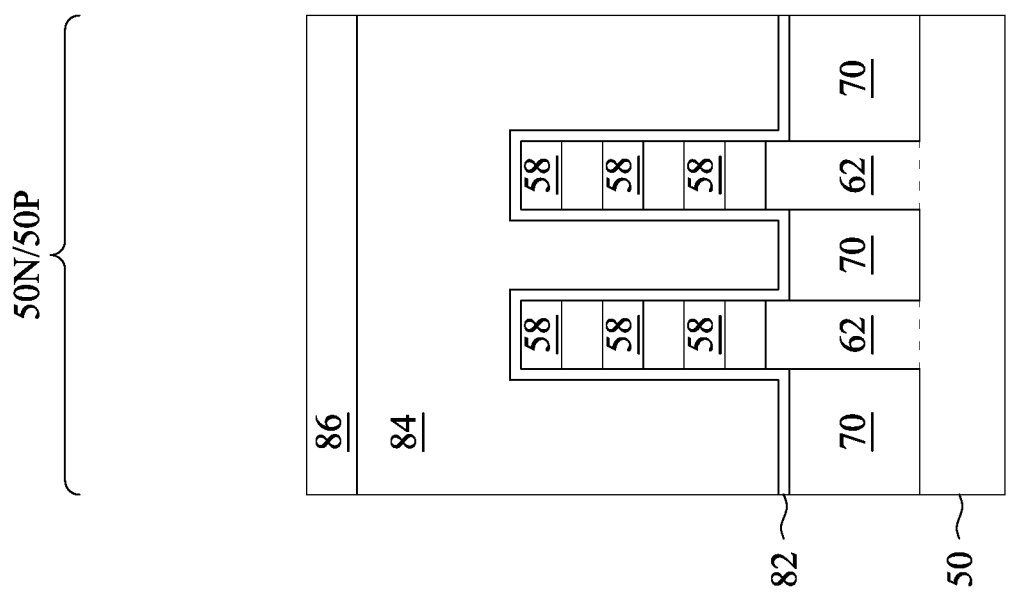

In FIGS. 12A-12B, a removal process is performed to level the top surfaces of the first ILD 104 with the top surfaces of the gate spacers 90 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, top surfaces of the first ILD 104, the gate spacers 90, and the masks 86 (if present) or the dummy gates 84 are substantially coplanar (within process variations). Accordingly, the top surfaces of the masks 86 (if present) or the dummy gates 84 are exposed through the first ILD 104.

Figure 13B:
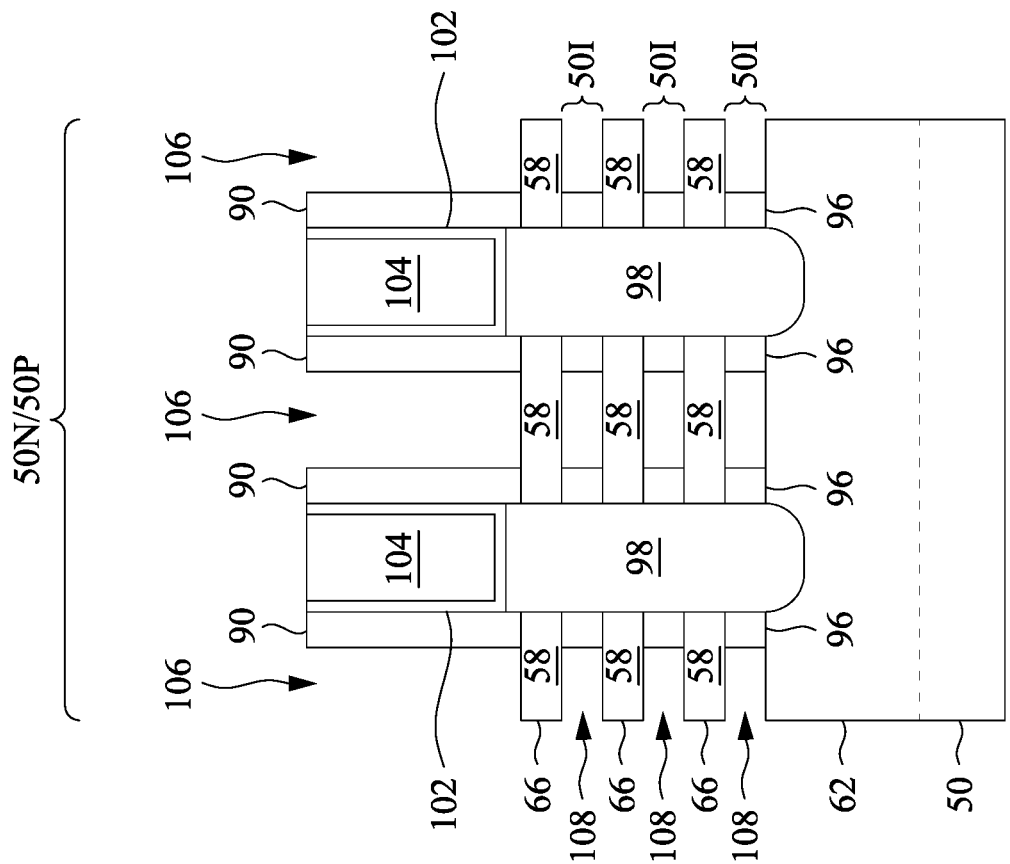
Figure 13A:
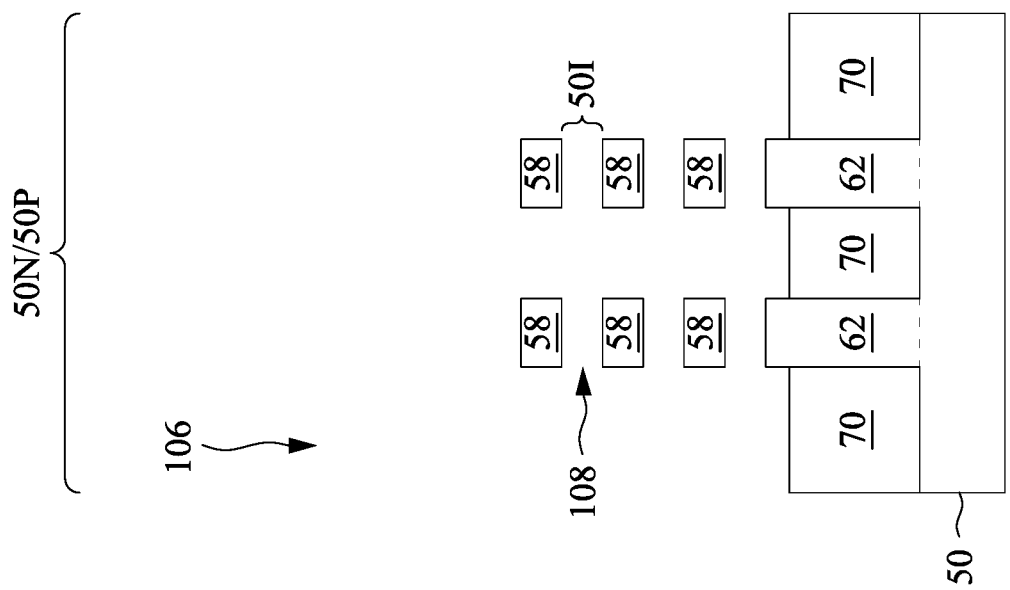

In FIGS. 13A-13B, the masks 86 (if present) and the dummy gates 84 are removed in one or more etching steps, so that recesses 106 are formed. Portions of the dummy dielectrics 82 in the recesses 106 are also removed. In some embodiments, the dummy gates 84 and the dummy dielectrics 82 are removed by an anisotropic dry etch process. For example, the etching process may include a dry etch process using reaction gas(es) that selectively etch the material of the dummy gates 84 at a faster rate than the materials of the first ILD 104 and the gate spacers 90. Each recesses 106 exposes and/or overlies portions of nanostructures 64, 66, which act as the channel regions 58 in subsequently completed nanostructure-FETs. Portions of the nanostructures 64, 66 which act as the channel regions 58 are disposed between neighboring pairs of the epitaxial source/drain regions 98. During the removal, the dummy dielectrics 82 may be used as etch stop layers when the dummy gates 84 are etched. The dummy dielectrics 82 may then be removed after the removal of the dummy gates 84.

The remaining portions of the first nanostructures 64 are then removed to form openings 108 in regions 50I between the second nanostructures 66. The remaining portions of the first nanostructures 64 can be removed by any acceptable etch process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etch process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second nanostructures 66 and expand the openings 108.

In another embodiment (not separately illustrated), the channel regions 58 in the n-type region 50N and the p-type region 50P may be formed separately, for example by removing the first nanostructures 64 in the n-type region 50N and by removing the second nanostructures 66 in the p-type region 50P. In such embodiments, the channel regions 58 in the n-type region 50N and the p-type region 50P may have different material compositions.

Figure 14B:
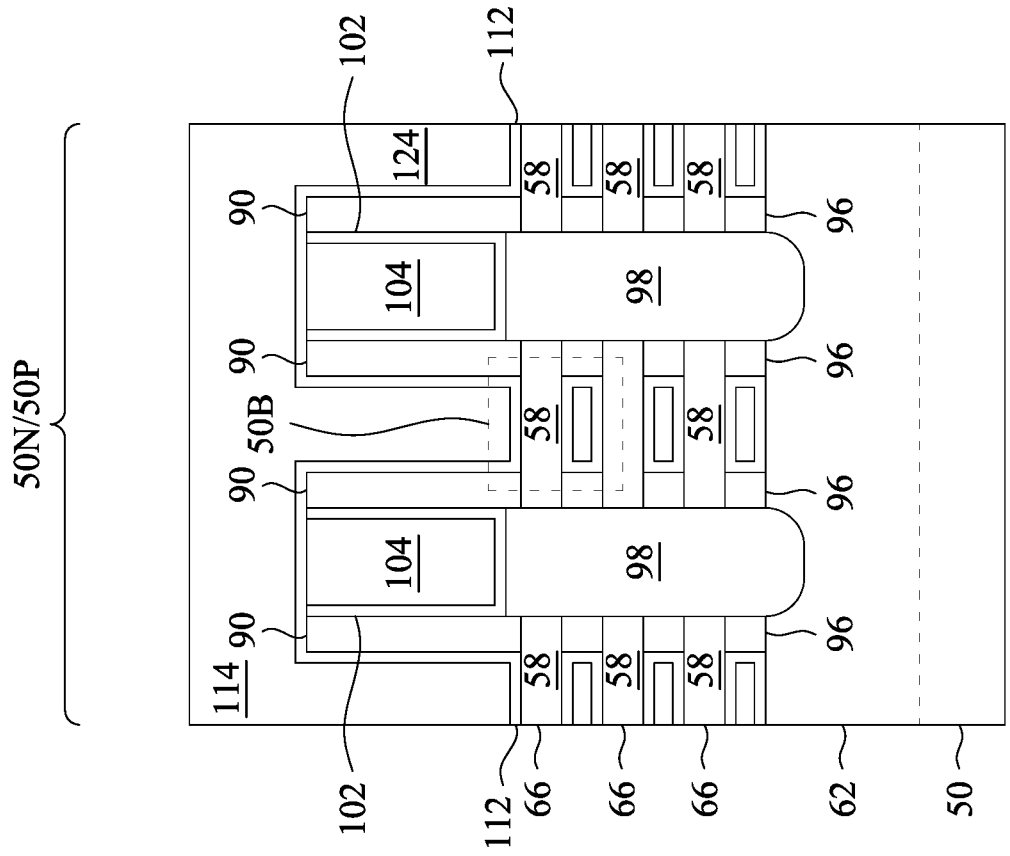
Figure 14A:
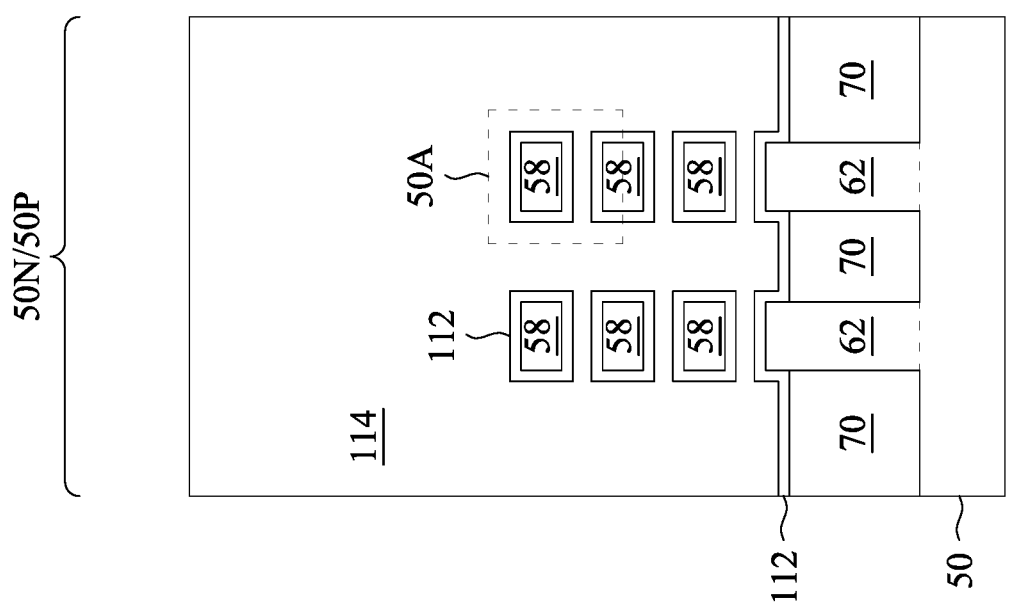

In FIGS. 14A-14B, a gate dielectric layer 112 is formed in the recesses 106 and the openings 108. A gate electrode layer 114 is then formed on the gate dielectric layer 112. The gate dielectric layer 112 and the gate electrode layer 114 are layers for replacement gates, and wrap around all (e.g., four) sides of the second nanostructures 66.

The gate dielectric layer 112 is disposed on the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90, and may be formed on the sidewalls of the fins 62 (e.g., in embodiments where the top surfaces of the STI regions 70 are below the top surfaces of the fins 62). The gate dielectric layer 112 may include an oxide such as silicon oxide or a metal oxide, a silicate such as a metal silicate, combinations thereof, multi-layers thereof, or the like. The gate dielectric layer 112 may include a high-dielectric constant (high-k) material having a k-value greater than about 7.0, such as a metal oxide or a silicate of hafnium, aluminum, zirconium, lanthanum, manganese, barium, titanium, lead, and combinations thereof. Although a single-layered gate dielectric layer 112 is illustrated in FIGS. 14A-14B, as will be subsequently described in greater detail, the gate dielectric layer 112 may include multiple layers, such as an interfacial layer and an overlying high-k dielectric layer.

The gate electrode layer 114 is disposed on the gate dielectric layer 112. The gate electrode layer 114 may include one or more metal-containing material(s) such as titanium nitride, titanium oxide, tantalum nitride, tantalum carbide, cobalt, ruthenium, aluminum, tungsten, combinations thereof, multi-layers thereof, or the like. Although a single-layered gate electrode layer 114 is illustrated in FIGS. 14A-14B, as will be subsequently described in greater detail, the gate electrode layer 114 may include any number of work function tuning layers, any number of glue layers, and a fill layer.

The formation of the gate dielectric layers 112 in the n-type region 50N and the p-type region 50P may occur simultaneously such that the gate dielectric layers 112 in each region are formed from the same materials, and the formation of the gate electrode layers 114 may occur simultaneously such that the gate electrode layers 114 in each region are formed from the same materials. In some embodiments, the gate dielectric layers 112 in each region may be formed by distinct processes, such that the gate dielectric layers 112 may be different materials and/or have a different number of layers, and/or the gate electrode layers 114 in each region may be formed by distinct processes, such that the gate electrode layers 114 may be different materials and/or have a different number of layers. Various masking steps may be used to mask and expose appropriate regions when using distinct processes. In the following description, at least portions of the gate electrode layers 114 in the n-type region 50N and the gate electrode layers 114 in the p-type region 50P are formed separately.

FIGS. 15A-20B illustrate a process in which a gate dielectric layer 112 and a gate electrode layer 114 for replacement gates are formed in the recesses 106 and the openings 108 in the p-type region 50P. FIGS. 15A, 16A, 17A, 18A, 19A, and 20A illustrate features in a region 50A in FIG. 14A. FIGS. 15B, 16B, 17B, 18B, 19B, and 20B illustrate features in a region 50B in FIG. 14B. The gate electrode layer 114 in the p-type region 50P includes two p-type work function tuning layers separated by a thin barrier layer. The n-type region 50N may be masked at least while forming portions of the gate electrode layer 114 in the p-type region 50P.

Figure 15B:
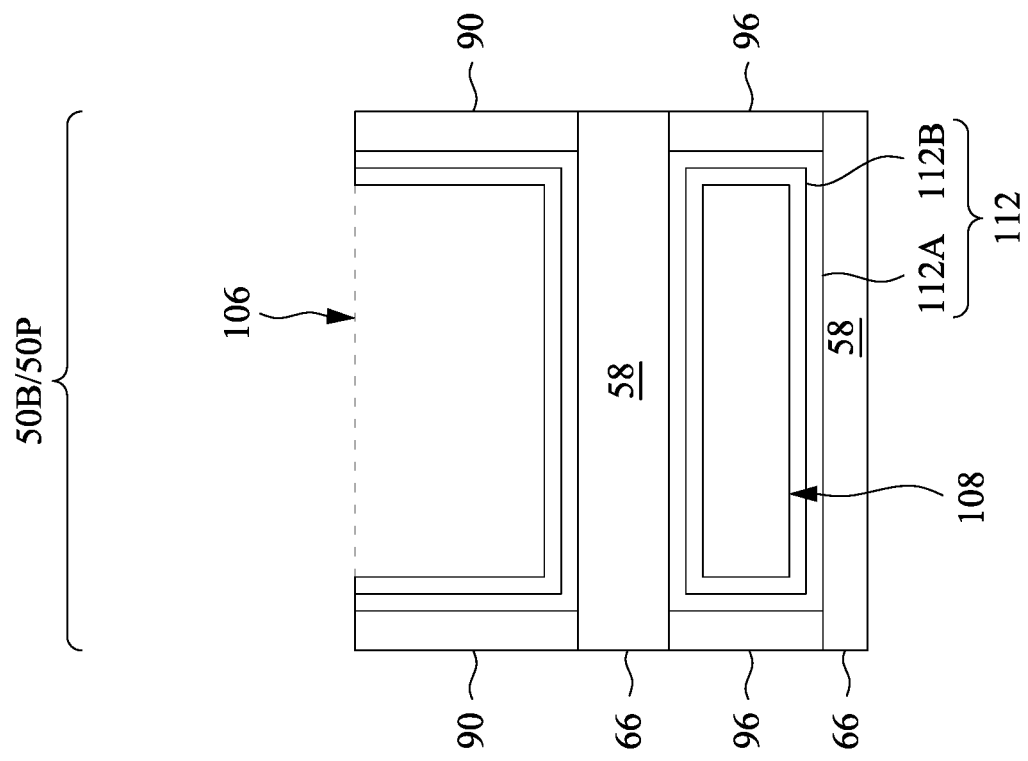
Figure 15A:
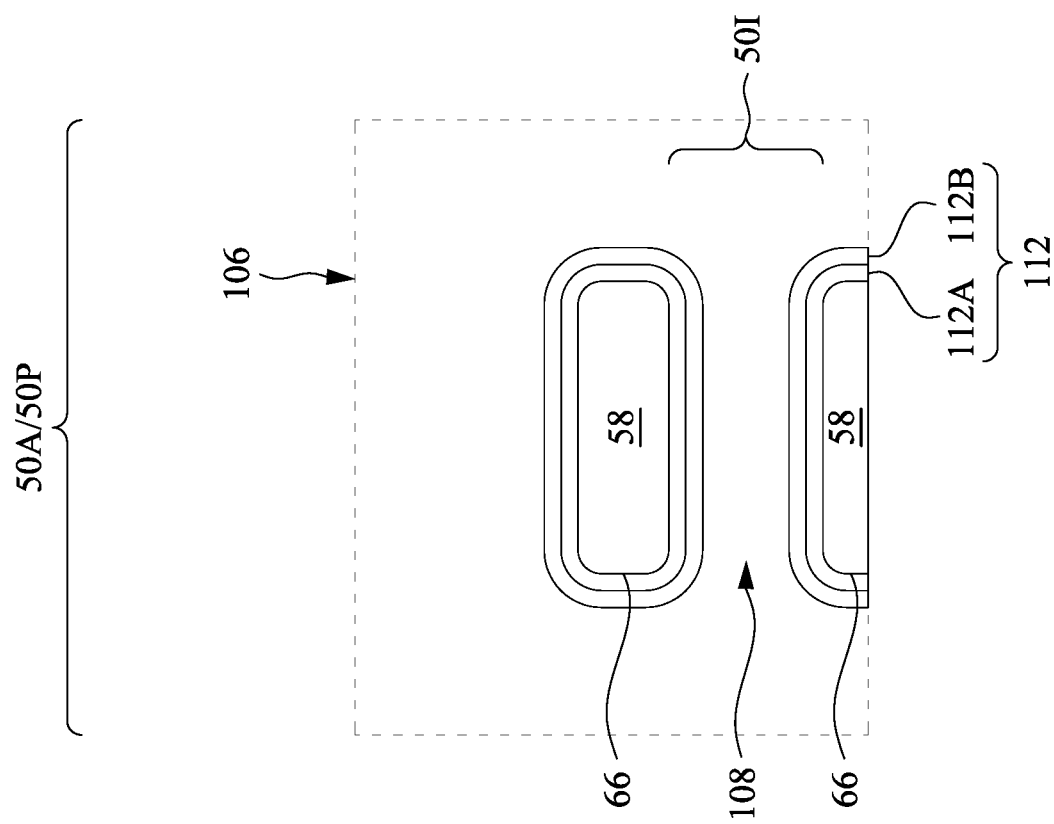

In FIGS. 15A-15B, the gate dielectric layer 112 is conformally formed on the channel regions 58 of the second nanostructures 66, such that it conformally lines the recesses 106 and the openings 108 in the p-type region 50P. The gate dielectric layer 112 may also be deposited on the top surfaces of the first ILD 104 and the gate spacers 90 (see FIG. 14B). The formation methods of the gate dielectric layer 112 may include molecular-beam deposition (MBD), ALD, PECVD, and the like. The gate dielectric layer 112 wraps around all (e.g., four) sides of the second nanostructures 66. In the illustrated embodiment, the gate dielectric layer 112 is multi-layered, including an interfacial layer 112A (or more generally, a first gate dielectric layer) and an overlying high-k dielectric layer 112B (or more generally, a second gate dielectric layer). In some embodiments, the interfacial layer 112A is formed of silicon oxide and the high-k dielectric layer 112B is formed of hafnium oxide. The gate dielectric layer 112 may include any acceptable number of layers.

Figure 16B:
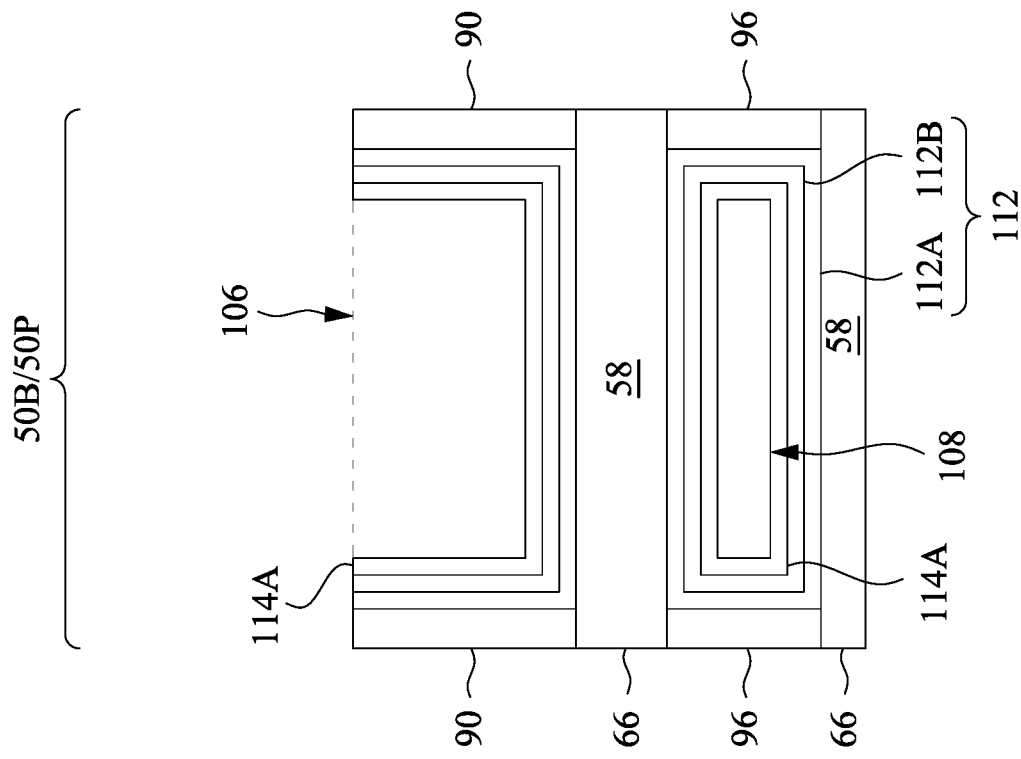
Figure 16A:
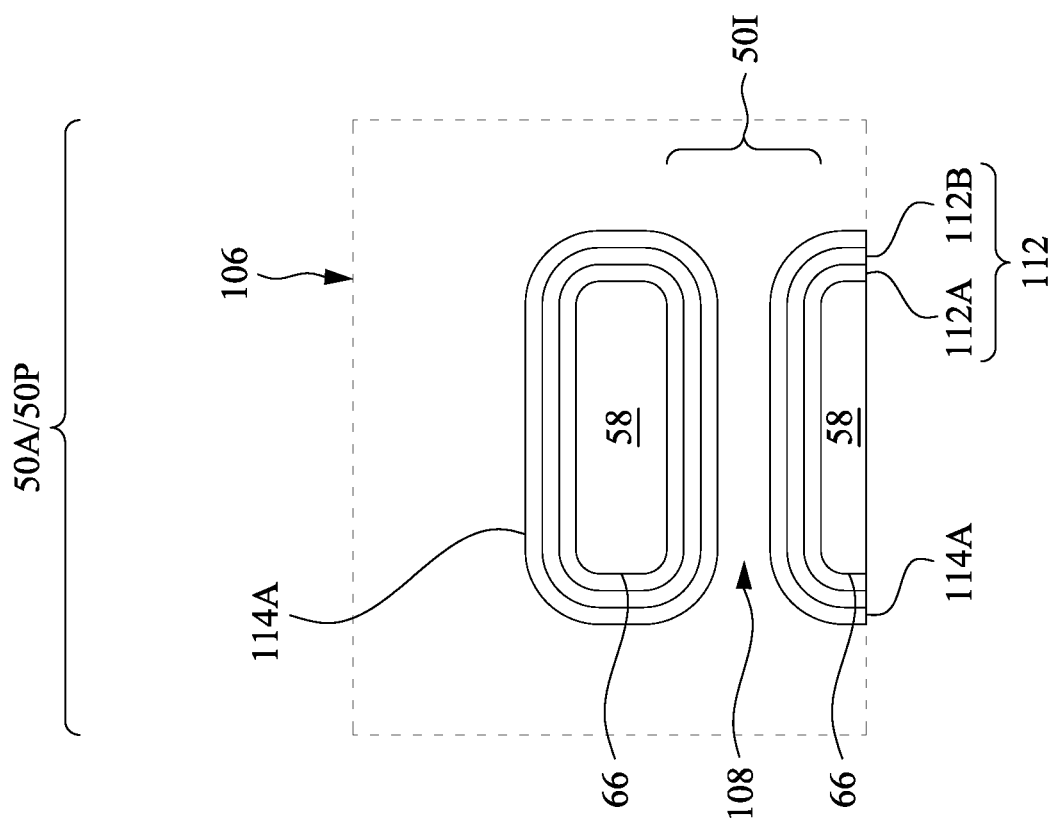

In FIGS. 16A-16B, a first p-type work function tuning layer 114A is conformally formed on the gate dielectric layer 112, such that it conformally lines the recesses 106 and the openings 108 in the p-type region 50P. The first p-type work function tuning layer 114A is formed of a p-type work function material (PWFM) that is acceptable to tune a work function of a nanostructure-FET to a desired amount given the application of the device to be formed, and may be formed by any acceptable deposition process. In some embodiments, the first p-type work function tuning layer 114A is formed of titanium nitride, tantalum nitride, combinations thereof, or the like, which may be formed by a deposition process such as PVD, ALD, CVD, or the like. In some embodiments, the first p-type work function tuning layer 114A has a thickness in the range 5 Å to 25 Å.

The PWFM of the first p-type work function tuning layer 114A includes a work function tuning element. The work function tuning element may be a metal, and the PWFM may be a nitride of that metal. As such, the PWFM may be a metal nitride. In some embodiments, the work function tuning element is titanium, the PWFM is titanium nitride, and the first p-type work function tuning layer 114A is deposited by PVD.

Figure 17B:
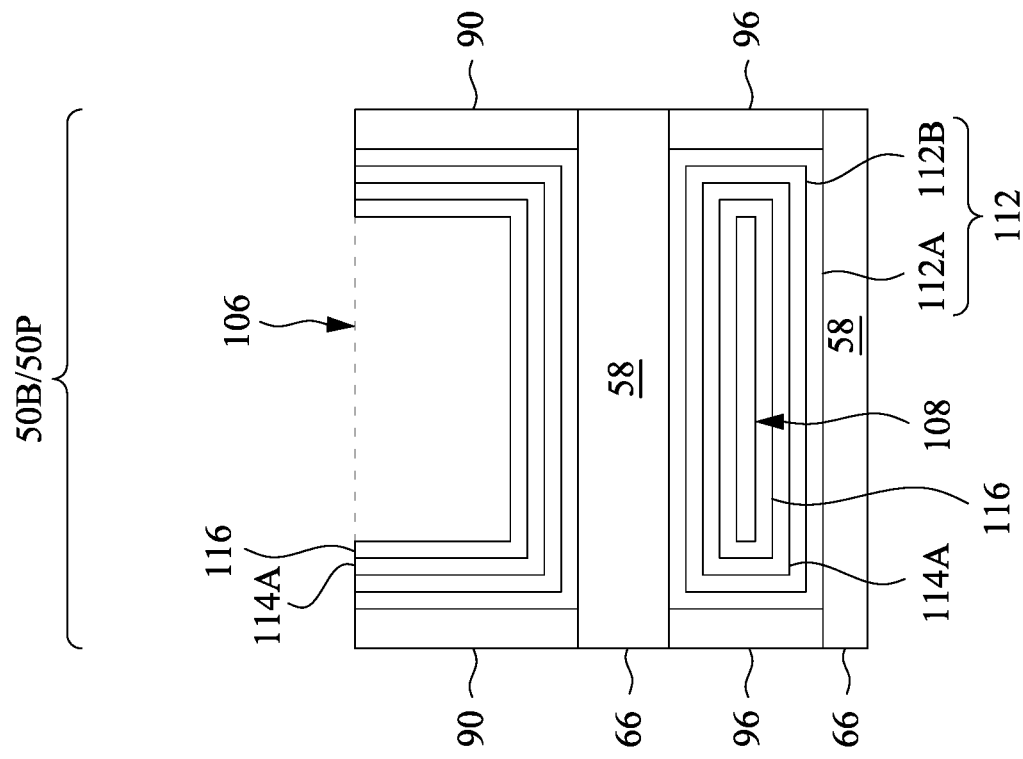
Figure 17A:
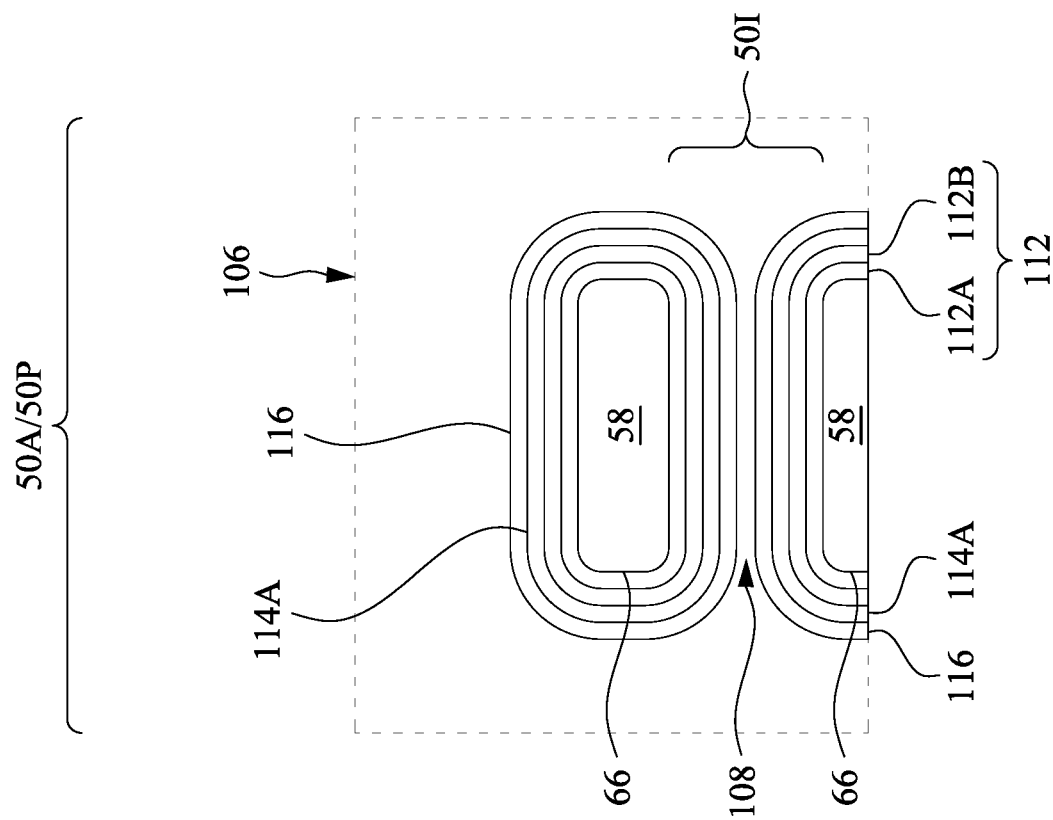

In FIGS. 17A-17B, a protection layer 116 is conformally formed on the first p-type work function tuning layer 114A, such that it conformally lines the recesses 106 and the openings 108 in the p-type region 50P. The protection layer 116 is formed of a sacrificial material such as amorphous silicon, polycrystalline-silicon (polysilicon), poly-crystalline silicon-germanium (poly-SiGe), metallic nitrides, metallic silicides, metallic oxides, or the like, which may be deposited by CVD, PVD, sputter deposition, or the like. In some embodiments, the protection layer 116 has a thickness in the range of 7 Å to 35 Å. The protection layer 116 is a sacrificial layer that will be used to protect the first p-type work function tuning layer 114A during a subsequent annealing process. Additionally, the first p-type work function tuning layer 114A may act as an adhesion layer for the protection layer 116.

After the protection layer 116 is formed, the first p-type work function tuning layer 114A and the gate dielectric layer 112 are annealed to modify the work function of the gate dielectric layer 112, thereby tuning the work functions of the resulting nanostructure-FETs. The annealing process may be a rapid thermal anneal, a spike anneal, or the like. The annealing process may be performed at a temperature in the range of 550° C. to 1400° C. and for a duration in the range of 0.1 millisecond to 5 minutes. The annealing process may be performed in an environment containing a process gas, such as an oxygen-containing process gas, a nitrogen-containing process gas, or the like. The annealing process may modify the work function of the gate dielectric layer 112 by modifying the interface of the gate dielectric layer 112 and the second nanostructures 66, driving nitrogen/oxygen into the gate dielectric layer 112, or the like. The protection layer 116 may protect the first p-type work function tuning layer 114A from oxidation during the annealing process.

Figure 18B:
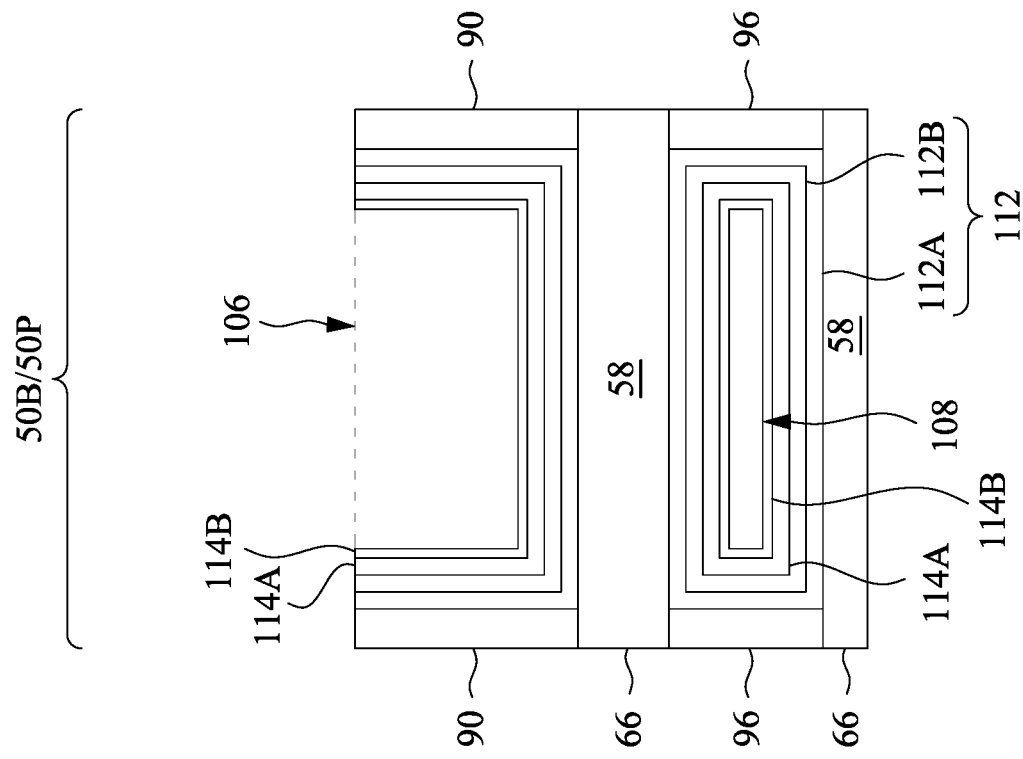
Figure 18A:
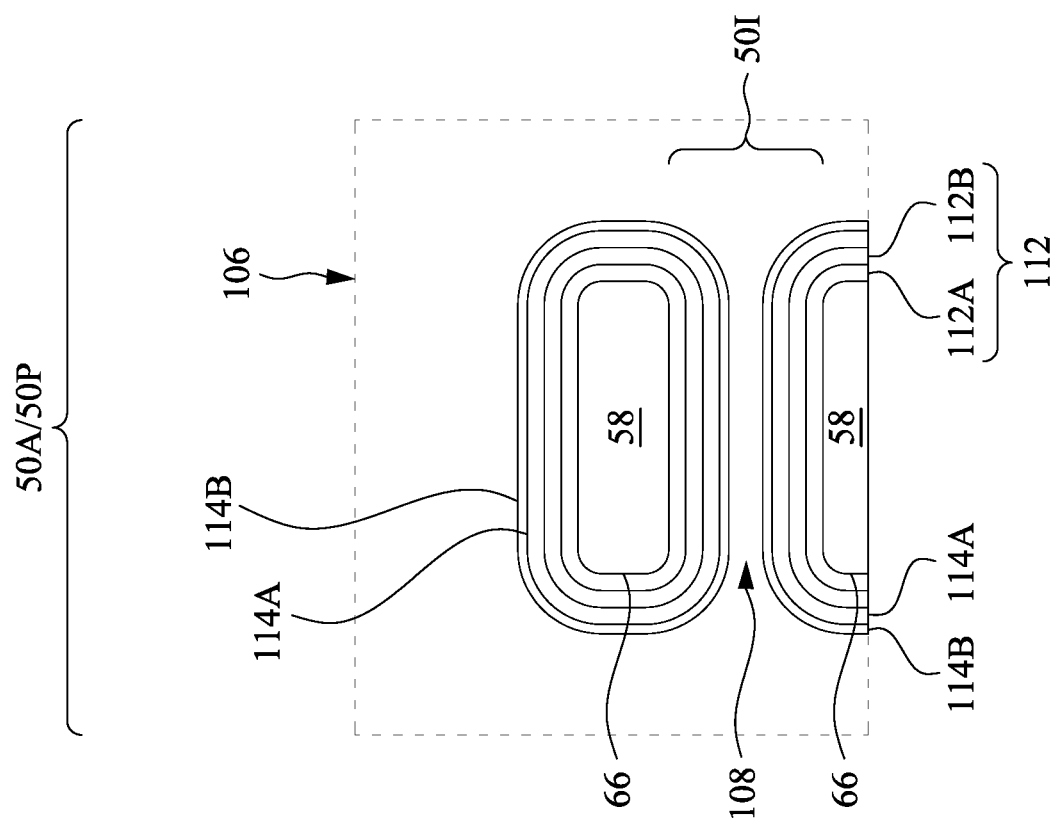

In FIGS. 18A-18B, the protection layer 116 is at least partially removed. At least a portion of the protection layer 116 may be removed with any acceptable etch process that is selective to the protection layer 116 (e.g., selectively etches the sacrificial material of the protection layer 116 at a faster rate than the material of the first p-type work function tuning layer 114A). The etch process may be isotropic. The etchant may be an oxygen-containing etchant. In some embodiments, the protection layer 116 is etched by a wet etch using potassium hydroxide (KOH), tetramethylammonium hydroxide (TMAH), acetic acid ($CH_3COOH$), hydrogen peroxide ($H_2O_2$), combinations thereof, or the like. Timed etch processes may be used to stop the etching after the protection layer 116 has been etched by a desired amount. In some embodiments, the etch process is performed for a duration in the range of 1 seconds to 3600 seconds. As noted above, the openings 108 are small. Further, the protection layer 116 is not required for proper operation of the resulting gate structures. Removing the protection layer 116 after the annealing process allows space to in the openings 108 to be freed up for subsequently formed work function tuning layers.

A barrier layer 114B is formed on the first p-type work function tuning layer 114A. The barrier layer 114B is a dielectric barrier layer that is formed as a result of the etching of the protection layer 116. The barrier layer 114B is formed of oxidized and/or nitrided residual material of the protection layer 116. As an example to form the barrier layer 114B, the protection layer 116 may be etched as previously described, specifically, by etching the protection layer 116 with an oxygen-containing etchant. The oxygen-containing etchant is selected to control the etching process so as to form the barrier layer 114B. In some embodiments where the protection layer 116 is formed of amorphous silicon, the oxygen-containing etchant used to etch the protection layer 116 is a mixture of hydrogen peroxide ($H_2O_2$) and hydrogen chloride (HCl). During etching of the protection layer 116, the protection layer 116 may be thinned until it is substantially removed (within process variations). For example, the material of the protection layer 116 remaining may be removed until the amount of remaining material is small enough that etching is substantially stopped (within process variations). In some embodiments, the protection layer 116 is thinned until the rate of thinning is less than a target rate (e.g., less than a predefined threshold). The residual material of the protection layer 116 is oxidized by the oxygen-containing etchant. When the first p-type work function tuning layer 114A is a metal nitride, the residual material of the protection layer 116 may also be nitrided by absorbing nitrogen from the metal nitride. As such, the barrier layer 114B is an oxide or an oxynitride of the material of the protection layer 116. In some embodiments where the protection layer 116 is formed of amorphous silicon and the first p-type work function tuning layer 114A is formed of titanium nitride, the barrier layer 114B is formed of silicon oxynitride. The barrier layer 114B is thin, and is thinner than the first p-type work function tuning layer 114A and subsequently formed overlying layers. In some embodiments, the barrier layer 114B has a thickness of less than about 5 Å, such as a thickness in the range of 1 Å to 5 Å. Forming the barrier layer 114B to a small thickness allows it to have a negligible impact on the resistance of the resulting gate structures, even though the barrier layer 114B is a dielectric layer. The barrier layer 114B may protect the first p-type work function tuning layer 114A from modification in subsequent processing.

The first p-type work function tuning layer 114A is not removed from the p-type region 50P, and underlies the barrier layer 114B. Another work function tuning layer will be subsequently formed on the barrier layer 114B. As such, the resulting gate structures in the p-type region 50P include multiple work function tuning layers of different thicknesses, separated by a thin dielectric layer (e.g., the barrier layer 114B). The work functions of the resulting gate structures may be more finely tuned by controlling the thicknesses of the various layers. Additionally, omitting a removal process for the first p-type work function tuning layer 114A in the p-type region 50P may advantageously allow the work function of the resulting gate structures in the p-type region 50P to be tuned to a desired amount without overshooting a target work function. Further, omitting removal of the first p-type work function tuning layer 114A from the p-type region 50P may help avoid damage to the gate dielectric layer 112 in the p-type region 50P, which may avoid degradation of the work function of the resulting gate structures. In some embodiments, omitting removal of the first p-type work function tuning layer 114A from the p-type region 50P (such that the first p-type work function tuning layer 114A and the barrier layer 114B are included in the resulting gate structures in the p-type region 50P) increases the work function of the resulting gate structures in the p-type region 50P by about 40 mV.

Figure 19B:
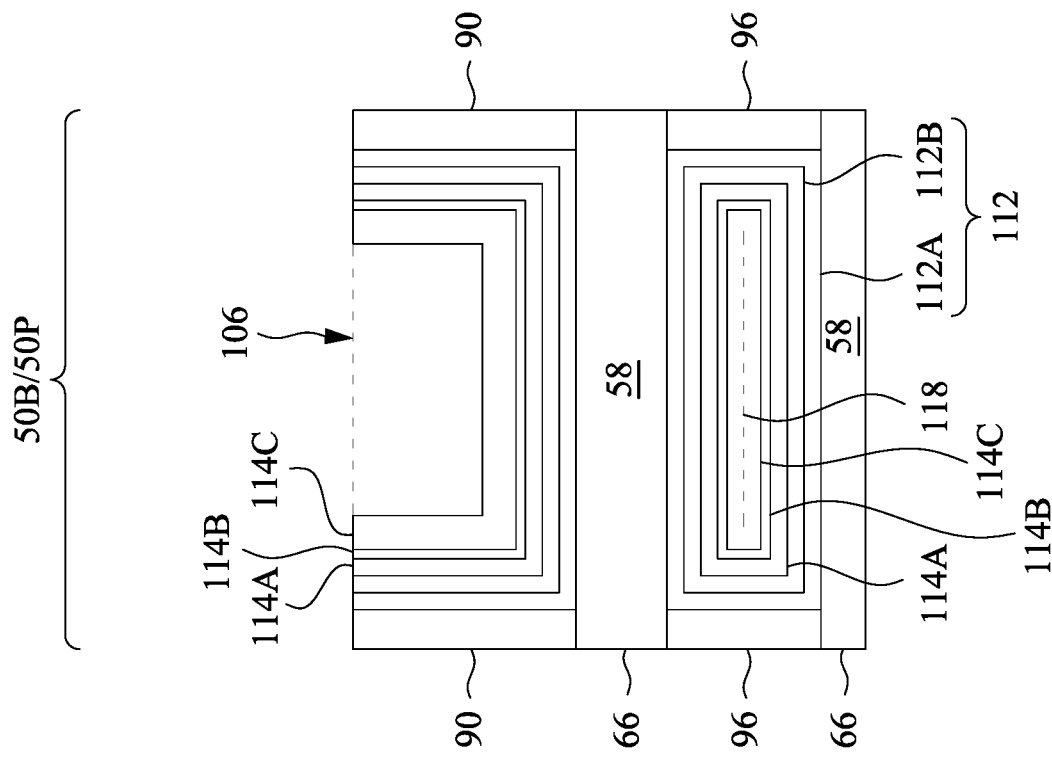
Figure 19A:
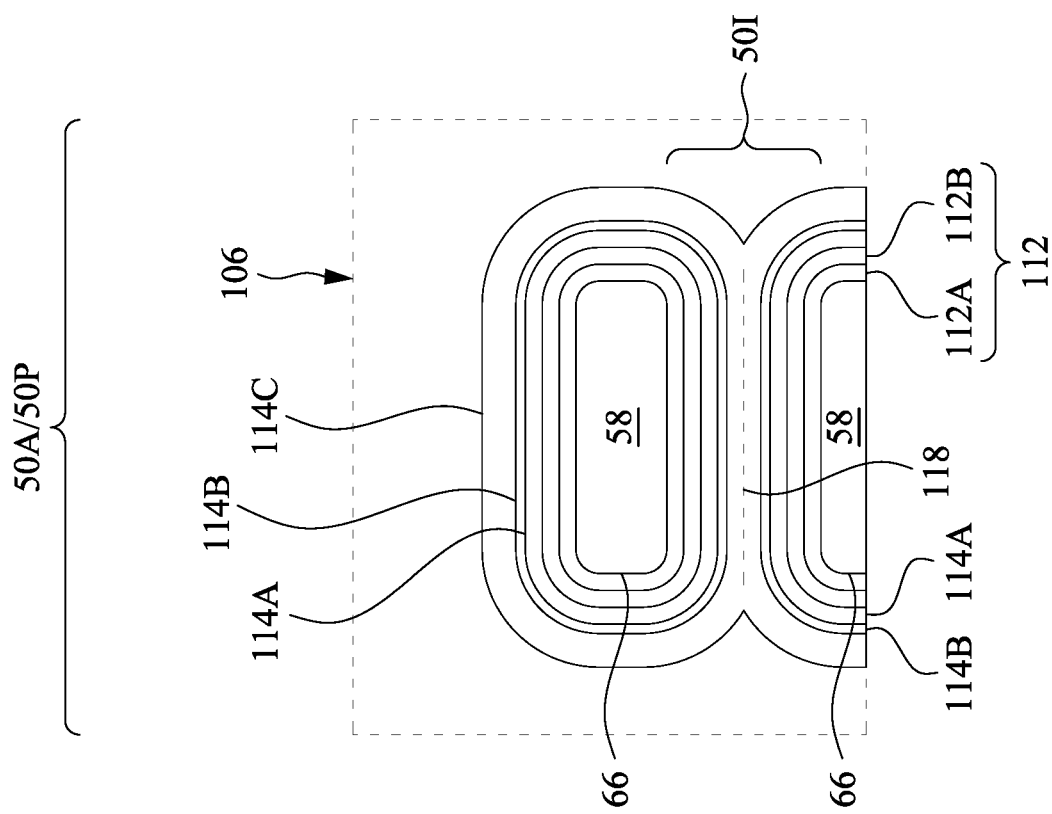

In FIGS. 19A-19B, a second p-type work function tuning layer 114C is conformally formed on the barrier layer 114B, such that it conformally lines the recesses 106 and the openings 108 in the p-type region 50P. The second p-type work function tuning layer 114C is formed of a p-type work function material (PWFM) that is acceptable to tune a work function of a nanostructure-FET to a desired amount given the application of the device to be formed, and may be formed by any acceptable deposition process. In some embodiments, the second p-type work function tuning layer 114C is formed of titanium nitride, tantalum nitride, combinations thereof, or the like, which may be formed by a deposition process such as PVD, ALD, CVD, or the like. In some embodiments, the second p-type work function tuning layer 114C has a thickness in the range 10 Å to 45 Å. The second p-type work function tuning layer 114C is thicker than the barrier layer 114B and the first p-type work function tuning layer 114A.

The PWFM of the second p-type work function tuning layer 114C includes a work function tuning element. The work function tuning element may be a metal, and the PWFM may be a nitride of that metal. In some embodiments, the work function tuning element is titanium, the PWFM is titanium nitride, and the second p-type work function tuning layer 114C is deposited by PVD. As such, the PWFM may be a metal nitride. In some embodiments, the second p-type work function tuning layer 114C is formed of the same PWFM as the first p-type work function tuning layer 114A. For example, the first p-type work function tuning layer 114A and the second p-type work function tuning layer 114C may both be formed of titanium nitride. The first p-type work function tuning layer 114A and the second p-type work function tuning layer 114C may each have the same concentration of the work function tuning element, or may have different concentrations of the work function tuning element. In some embodiments, the second p-type work function tuning layer 114C is formed of a different PWFM than the first p-type work function tuning layer 114A.

The second p-type work function tuning layer 114C fills the remaining portions of the regions 50I between the second nanostructures 66 in the p-type region 50P (e.g., the remaining portions of the openings 108 in the p-type region 50P). Specifically, the second p-type work function tuning layer 114C is deposited on the barrier layer 114B until it is thick enough to merge and seam together in the openings 108. As noted above, the first p-type work function tuning layer 114A is thinner than the second p-type work function tuning layer 114C, which may avoid merging of the first p-type work function tuning layer 114A and promote merging of the second p-type work function tuning layer 114C. Interfaces 118 may be shared by the contacting of adjacent portions of the second p-type work function tuning layer 114C (e.g., those portions around the second nanostructures 66 in the p-type region 50P). The openings 108 in the p-type region 50P are thus completely filled by respective portions of the gate dielectric layer 112, the first p-type work function tuning layer 114A, the barrier layer 114B, and the second p-type work function tuning layer 114C. Specifically, respective portions of the gate dielectric layer 112 wrap around respective second nanostructures 66 in the p-type region 50P, respective portions of the first p-type work function tuning layer 114A wrap around the respective portions of the gate dielectric layer 112, respective portions of the barrier layer 114B wrap around the respective portions of the first p-type work function tuning layer 114A, and respective portions of the second p-type work function tuning layer 114C wrap around the respective portions of the barrier layer 114B, thereby completely filling areas between the respective second nanostructures 66. A majority of each opening 108 in the p-type region 50P is filled by a respective portion of the second p-type work function tuning layer 114C, so that the second p-type work function tuning layer 114C dominates the work function of the resulting gate structures in the p-type region 50P.

Figure 20B:
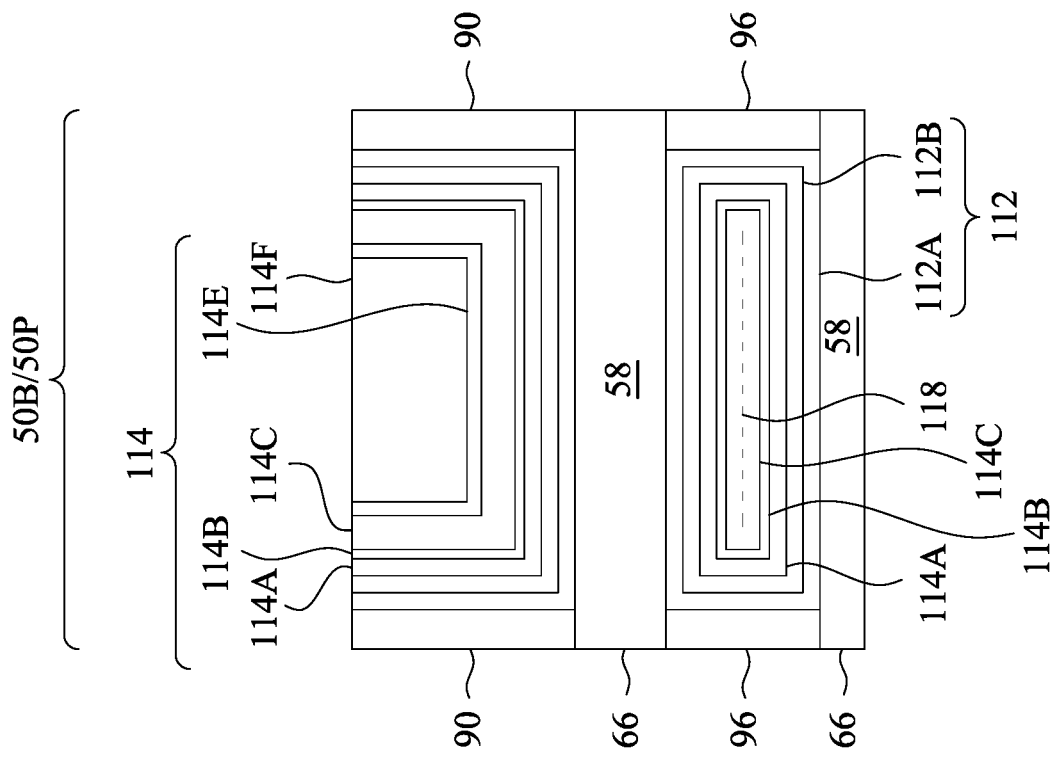
Figure 20A:
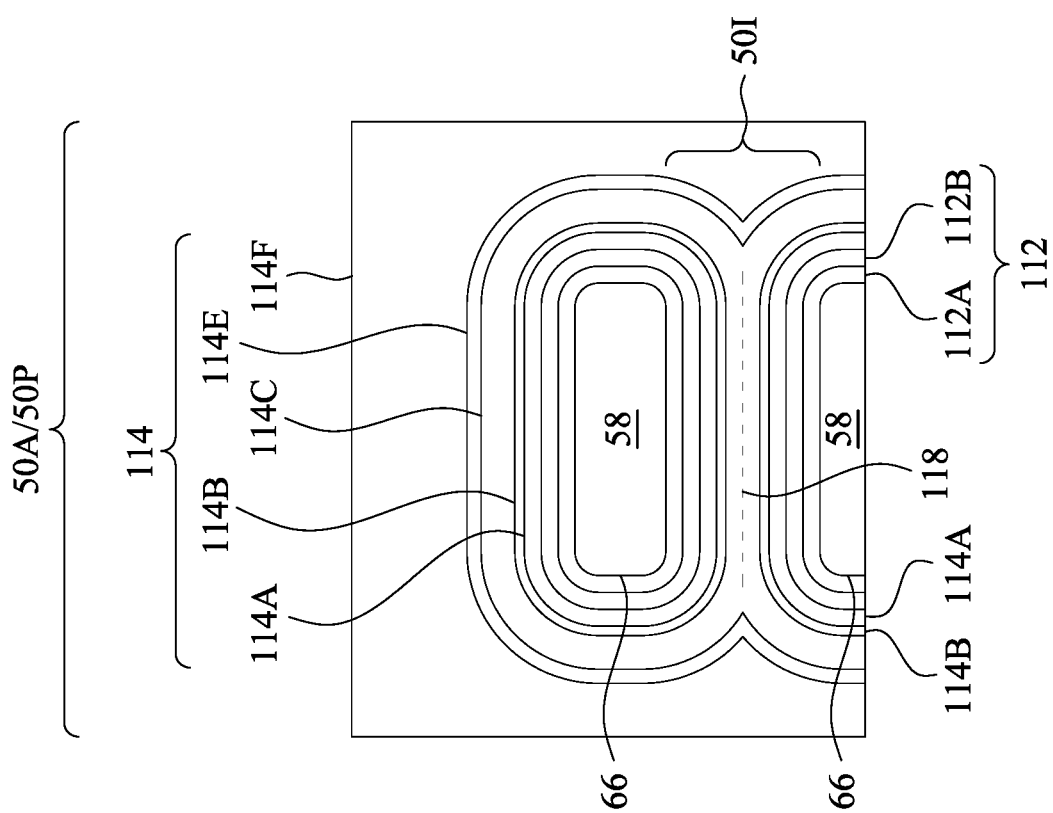

In FIGS. 20A-20B, the remaining portions of the gate electrode layer 114 are formed in the recesses 106 in the p-type region 50P. In the illustrated embodiment, a glue layer 114E is deposited on the second p-type work function tuning layer 114C, and a fill layer 114F is deposited on the glue layer 114E. After formation is complete, the gate electrode layer 114 in the p-type region 50P includes the first p-type work function tuning layer 114A, the barrier layer 114B, the second p-type work function tuning layer 114C, the glue layer 114E, and the fill layer 114F.

The glue layer 114E may be conformally formed on the second p-type work function tuning layer 114C. The glue layer 114E may be formed of a conductive material such as titanium nitride, tantalum nitride, titanium carbide, tantalum carbide, or the like, which may be formed by a deposition process such as CVD, ALD, PECVD, PVD, or the like. The glue layer 114E may act as an adhesion layer for the fill layer 114F.

The fill layer 114F may be conformally formed on the glue layer 114E. In some embodiments, the fill layer 114F may be formed of a conductive material such as cobalt, ruthenium, aluminum, tungsten, combinations thereof, or the like, which may be formed by a deposition process such as CVD, ALD, PECVD, PVD, or the like. The fill layer 114F fills the remaining portions of the recesses 106 in the p-type region 50P.

Figure 21B:
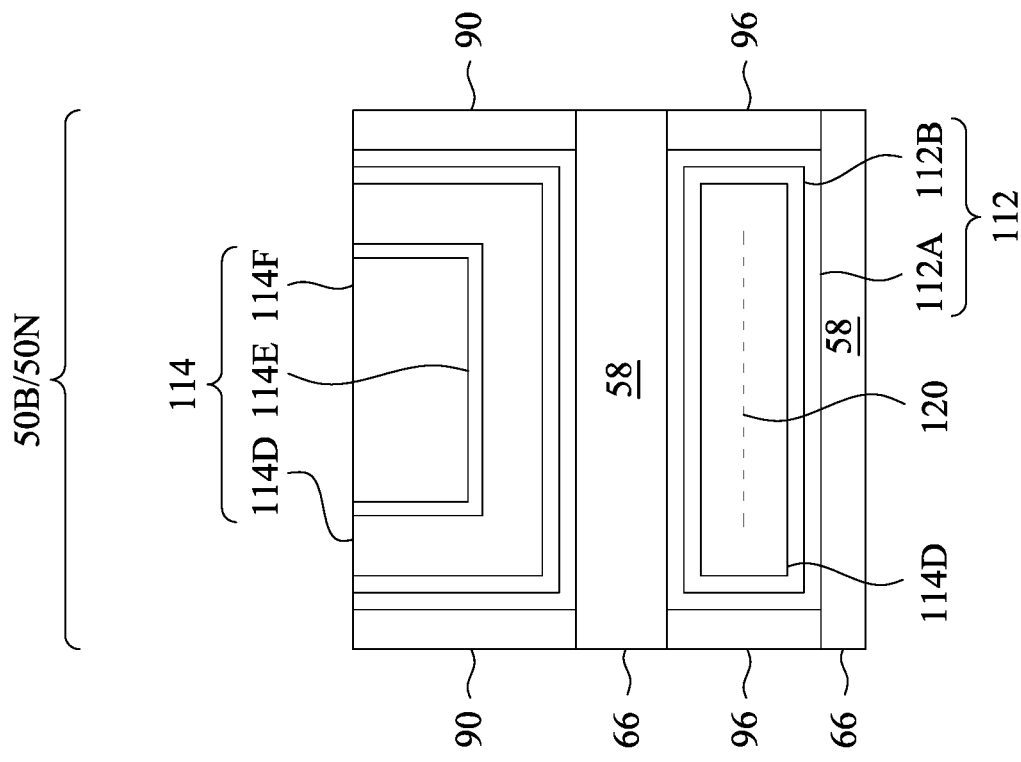
Figure 21A:
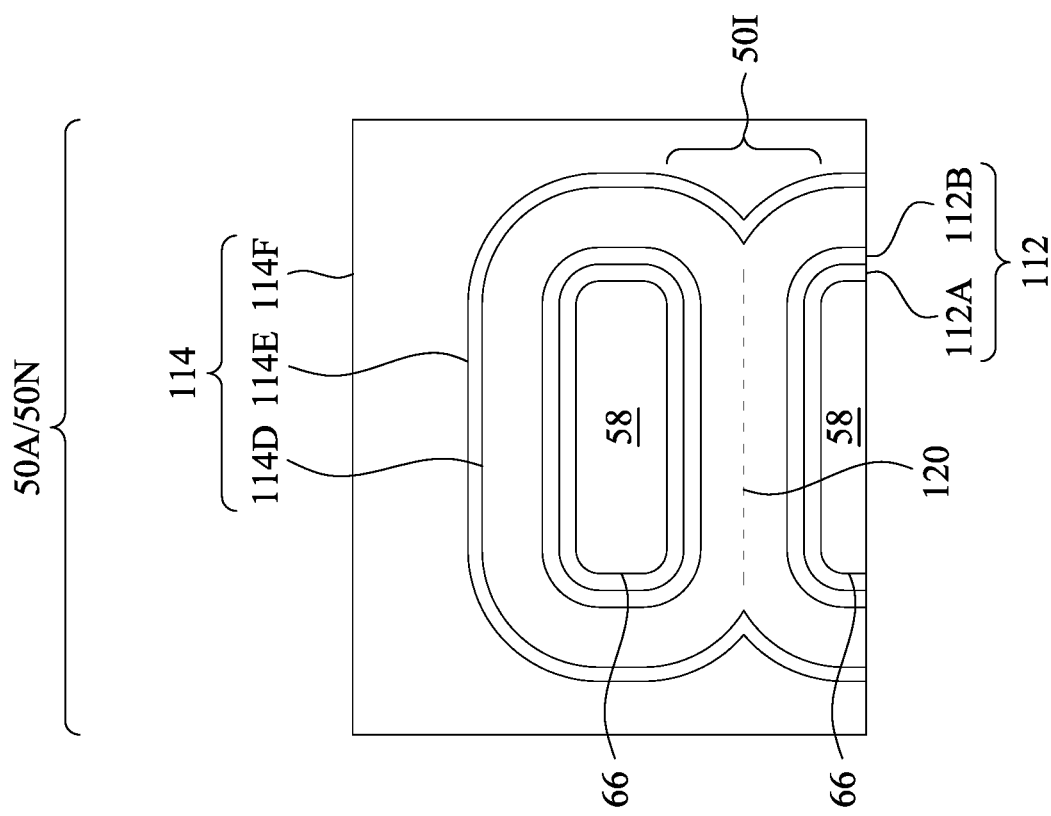

FIGS. 21A-21B illustrate a gate dielectric layer 112 and a gate electrode layer 114 for replacement gates, which are formed in the recesses 106 and the openings 108 in the n-type region 50N. FIG. 21A illustrates features in a region 50A in FIG. 14A. FIG. 21B illustrates features in a region 50B in FIG. 14B. In some embodiments, the gate dielectric layers 112 in the n-type region 50N and the p-type region 50P are formed simultaneously, and at least portions of the gate electrode layers 114 in the n-type region 50N and the p-type region 50P are formed separately. As such, the gate electrode layer 114 in the n-type region 50N may include different materials than the gate electrode layer 114 in the p-type region 50P. For example, the gate electrode layer 114 in the n-type region 50N may include an n-type work function tuning layer 114D, a glue layer 114E, and a fill layer 114F. The n-type work function tuning layer 114D is formed of an n-type work function material (NWFM) that is acceptable to tune a work function of a nanostructure-FET to a desired amount given the application of the device to be formed, and may be formed by any acceptable deposition process. In some embodiments, the n-type work function tuning layer 114D is formed of titanium aluminum, titanium aluminum carbide, tantalum aluminum, tantalum carbide, combinations thereof, or the like, which may be formed by a deposition process such as ALD, CVD, PVD, or the like. In some embodiments, the n-type work function tuning layer 114D has a thickness in the range of 10 Å to 60 Å. The n-type work function tuning layer 114D is formed of a different material than the first p-type work function tuning layer 114A, the barrier layer 114B, and the second p-type work function tuning layer 114C. The glue layer 114E in the n-type region 50N may (or may not) be formed of the same material as the glue layer 114E in the p-type region 50P, and may (or may not) be formed concurrently with the glue layer 114E in the p-type region 50P. The fill layer 114F in the n-type region 50N may (or may not) be formed of the same material as the fill layer 114F in the p-type region 50P, and may (or may not) be formed concurrently with the fill layer 114F in the p-type region 50P.

The n-type work function tuning layer 114D fills the remaining portions of the regions 50I between the second nanostructures 66 in the n-type region 50N (e.g., the remaining portions of the openings 108 in the n-type region 50N). Specifically, the n-type work function tuning layer 114D is deposited on the gate dielectric layers 112 until it is thick enough to merge and seam together in the openings 108. Interfaces 120 may be formed by the contacting of adjacent portions of the n-type work function tuning layer 114D (e.g., those portions around the second nanostructures 66 in the n-type region 50N). The openings 108 in the n-type region 50N are thus completely filled by respective portions of the gate dielectric layer 112 and the n-type work function tuning layer 114D. Specifically, respective portions of the gate dielectric layer 112 wrap around respective second nanostructures 66 in the n-type region 50N and respective portions of the n-type work function tuning layer 114D wrap around the respective portions of the gate dielectric layer 112, thereby completely filling areas between the respective second nanostructures 66. A majority of each opening 108 in the n-type region 50N is filled by a respective portion of the n-type work function tuning layer 114D, so that the n-type work function tuning layer 114D dominates the work function of the resulting gate structures in the n-type region 50N.

The gate dielectric layer 112 and the n-type work function tuning layer 114D fill the regions 50I in the n-type region 50N. The gate dielectric layer 112, the first p-type work function tuning layer 114A, the barrier layer 114B, and the second p-type work function tuning layer 114C fill the regions 50I in the p-type region 50P. The thickness of the portions of the n-type work function tuning layer 114D in the regions 50I is equal to a combined thickness of the portions of the first p-type work function tuning layer 114A, the barrier layer 114B, and the second p-type work function tuning layer 114C in the regions 50I. Only the gate electrode layer 114 in the p-type region 50P includes the barrier layer 114B. The gate electrode layer 114 in the n-type region 50N is free of the barrier layer 114B.

At least portions of the gate electrode layer 114 in the n-type region 50N may be formed either before or after forming the gate electrode layer 114 in the p-type region 50P, and the p-type region 50P may be masked at least while forming portions of the gate electrode layer 114 in the n-type region 50N. For example, the first p-type work function tuning layer 114A, the barrier layer 114B, and the second p-type work function tuning layer 114C may be formed in both the n-type region 50N and the p-type region 50P. The first p-type work function tuning layer 114A, the barrier layer 114B, and the second p-type work function tuning layer 114C may then be removed from the n-type region 50N such that they remain in the p-type region 50P. The n-type work function tuning layer 114D may then be formed in the n-type region 50N while the p-type region 50P is masked. The glue layer 114E and the fill layer 114F may then be formed in both the n-type region 50N and the p-type region 50P.

In FIGS. 22A-22B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 122 and gate electrodes 124. In some embodiments, a planarization process such as a chemical mechanical polish (CMP), an etch-back process, combinations thereof, or the like may be utilized. The gate dielectric layer 112, when planarized, has portions left in the recesses 106 and the openings 108 (thus forming the gate dielectrics 122). The gate electrode layer 114, when planarized, has portions left in the recesses 106 and the openings 108 (thus forming the gate electrodes 124). The top surfaces of the gate spacers 90; the CESL 102; the first ILD 104; the gate dielectrics 122 (e.g., the interfacial layers 112A and the high-k dielectric layers 112B; see FIGS. 15A-21B); and the gate electrodes 124 (e.g., the first p-type work function tuning layers 114A, the barrier layers 114B, the second p-type work function tuning layers 114C, the n-type work function tuning layers 114D, the glue layers 114E, and the fill layers 114F; see FIGS. 15A-21B) are substantially coplanar (within process variations). The gate dielectrics 122 and the gate electrodes 124 form replacement gates of the resulting nanostructure-FETs. Each respective pair of a gate dielectric 122 and a gate electrode 124 may be collectively referred to as a "gate structure." The gate structures each extend along top surfaces, sidewalls, and bottom surfaces of a channel region 58 of the second nanostructures 66.

Figure 23B:
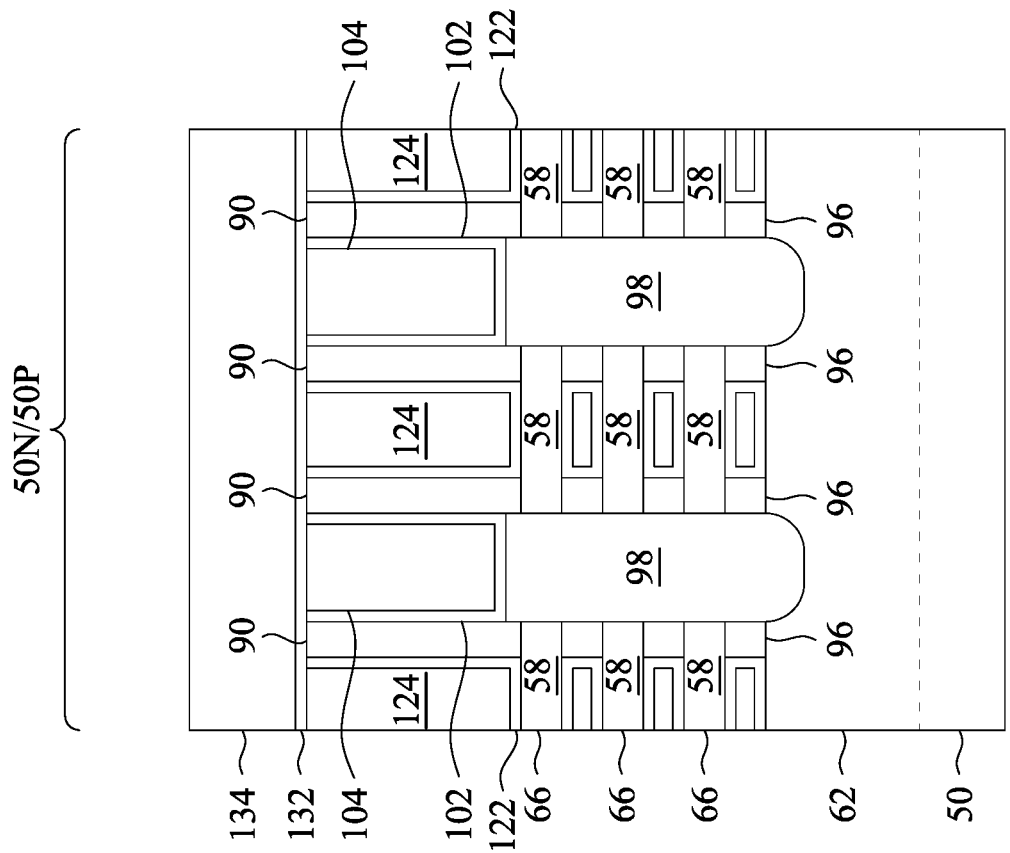
Figure 23A:
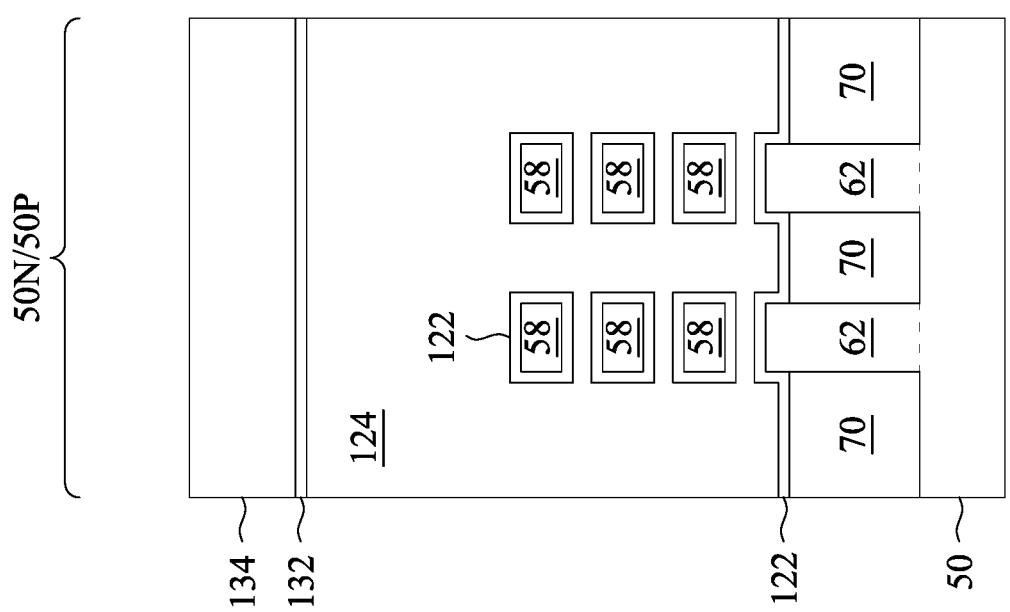

In FIGS. 23A-23B, a second ILD 134 is deposited over the gate spacers 90, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be formed by any suitable deposition process, such as CVD, PECVD, or the like.

In some embodiments, an etch stop layer (ESL) 132 is formed between the second ILD 134 and the gate spacers 90, the CESL 102, the first ILD 104, the gate dielectrics 122, and the gate electrodes 124. The ESL 132 may be formed of a dielectric material having a high etching selectivity from the etching of the second ILD 134, such as silicon nitride, silicon oxide, silicon oxynitride, or the like, which may be formed by any suitable deposition process, such as CVD, ALD, or the like.

Figure 24B:
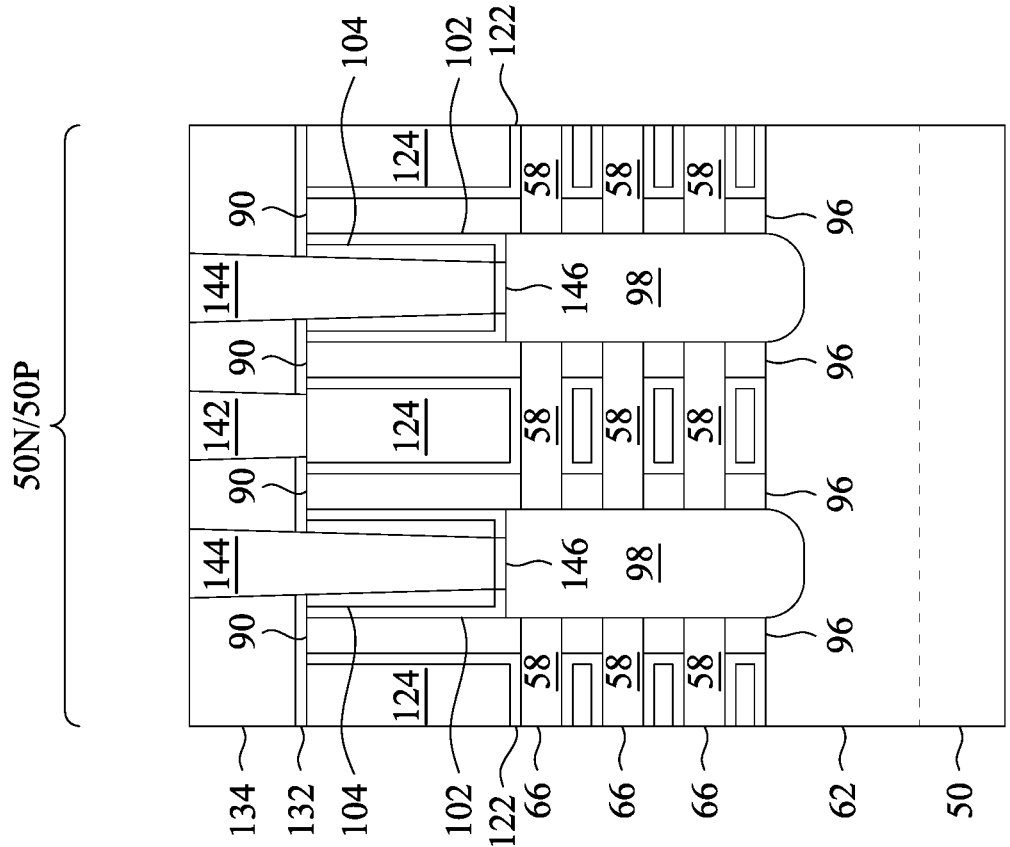
Figure 24A:
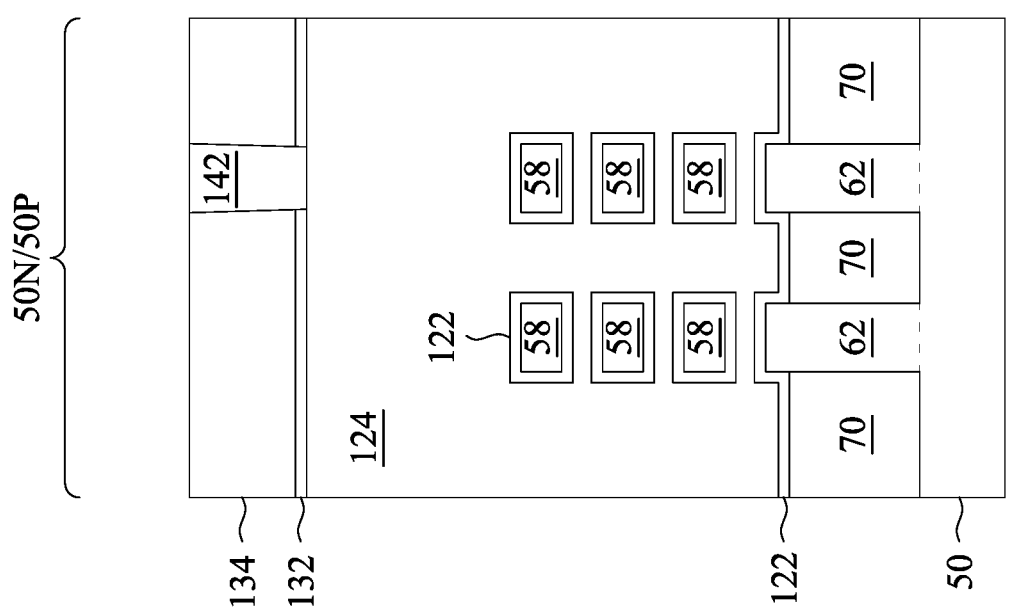

In FIGS. 24A-24B, gate contacts 142 and source/drain contacts 144 are formed to contact, respectively, the gate electrodes 124 and the epitaxial source/drain regions 98. The gate contacts 142 are physically and electrically coupled to the gate electrodes 124. The source/drain contacts 144 are physically and electrically coupled to the epitaxial source/drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal annealing process. The metal can be any metal capable of reacting with the semiconductor materials (e.g., silicon, silicon carbide, silicon germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals, or their alloys. The metal may be formed by a deposition process such as ALD, CVD, PVD, or the like. After the thermal annealing process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Figure 25A:
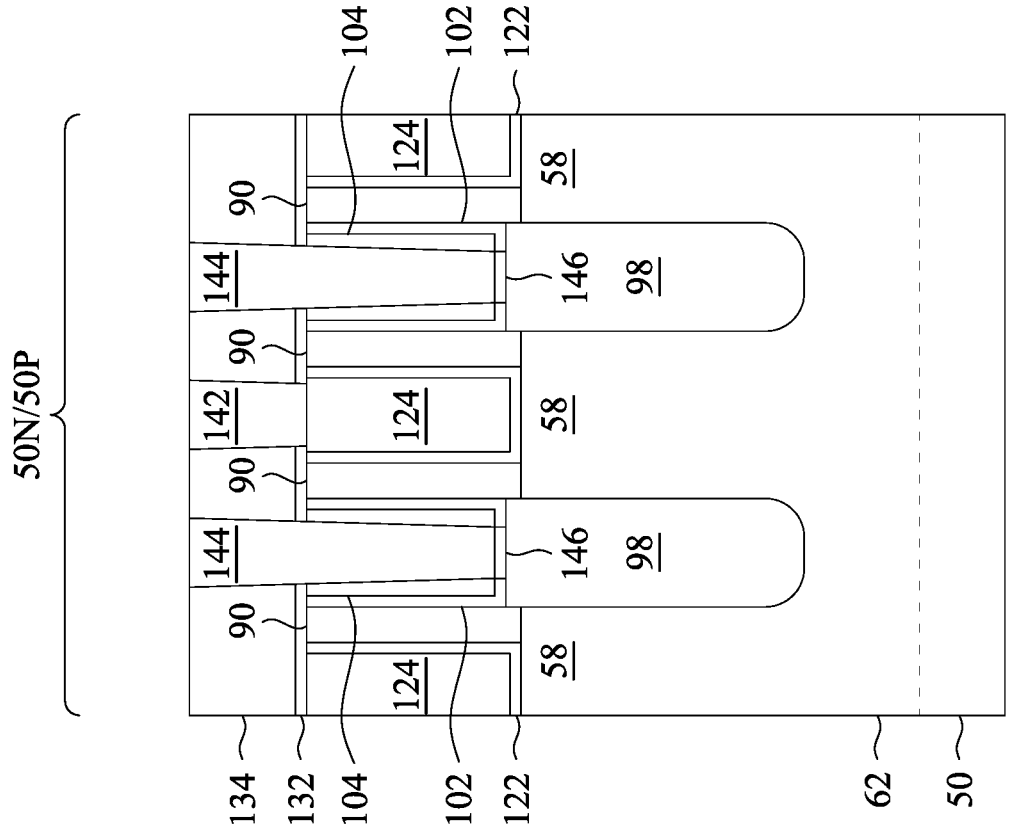
FIGS. 25A-25B are views of FinFETs, in accordance with some embodiments.
Figure 25B:
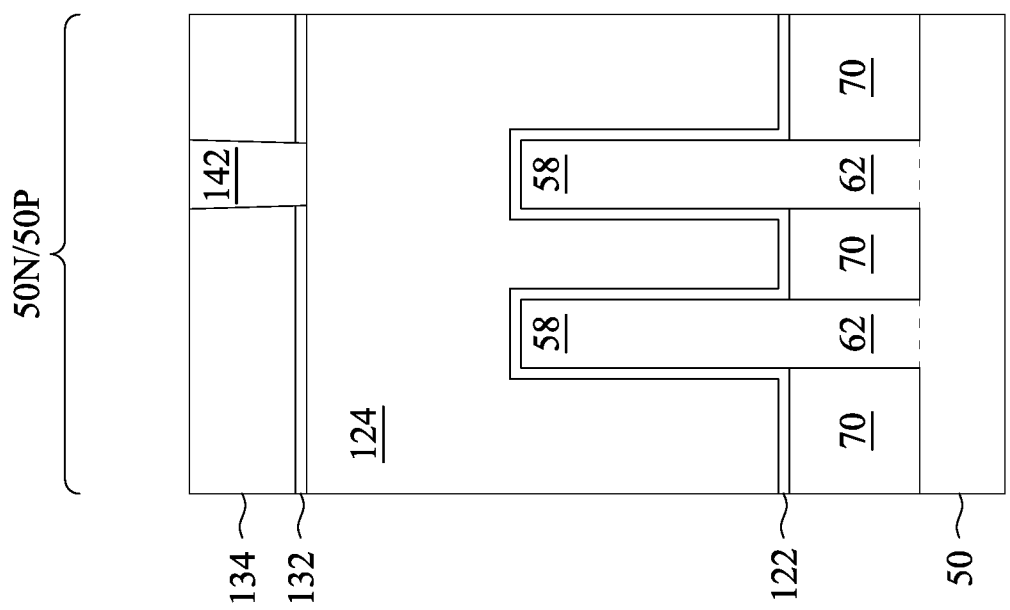

FIGS. 25A-25B are views of FinFETs, in accordance with some embodiments. The FinFETs may be manufactured by a similar process as the previously described nanostructure-FETs, except the nanostructures 64, 66 are omitted. Instead, the fins 62 are semiconductor features which act as channel regions 58 for the FinFETs. The gate structures (including the gate dielectrics 122 and the gate electrodes 124) are formed to extend along the top surfaces and the sidewalls of the channel regions 58 of the fins 62.

Embodiments may achieve advantages. The protection layer 116 protects the first p-type work function tuning layer 114A from oxidation during the annealing process for modifying the work function of the gate dielectric layer 112. Removing the protection layer 116 with an oxygen-containing etchant promotes formation of the barrier layer 114B. The barrier layer 114B may protect the first p-type work function tuning layer 114A from modification in subsequent processing. Additionally, leaving the first p-type work function tuning layer 114A in the gate structures in the p-type region 50P (instead of removing it from the p-type region 50P) may be advantageous. Omitting removal of the first p-type work function tuning layer 114A from the p-type region 50P may help avoid damage to the gate dielectric layer 112 in the p-type region 50P, which may avoid degradation of the work function of the gate structures. Forming the gate structures with a desired work function may improve the performance of the resulting devices.

In an embodiment, a device includes: a first nanostructure; a gate dielectric layer around the first nanostructure; a first p-type work function tuning layer on the gate dielectric layer; a dielectric barrier layer on the first p-type work function tuning layer; and a second p-type work function tuning layer on the dielectric barrier layer, the dielectric barrier layer being thinner than the first p-type work function tuning layer and the second p-type work function tuning layer. In some embodiments of the device, the second p-type work function tuning layer is thicker than the first p-type work function tuning layer. In some embodiments of the device, the first p-type work function tuning layer includes a same p-type work function material as the second p-type work function tuning layer. In some embodiments of the device, the first p-type work function tuning layer includes a different p-type work function material than the second p-type work function tuning layer. In some embodiments of the device, the first p-type work function tuning layer and the second p-type work function tuning layer each include a metal nitride. In some embodiments of the device, the dielectric barrier layer includes silicon oxynitride. In some embodiments of the device, the dielectric barrier layer has a thickness of less than about 5 Å.

In an embodiment, a device includes: a first nanostructure; a second nanostructure; a first gate dielectric layer around the first nanostructure and the second nanostructure; a first p-type work function tuning layer on the first gate dielectric layer; a dielectric barrier layer on the first p-type work function tuning layer; and a second p-type work function tuning layer on the dielectric barrier layer, a first area between the first nanostructure and the second nanostructure being completely filled by the first gate dielectric layer, the first p-type work function tuning layer, the dielectric barrier layer, and the second p-type work function tuning layer. In some embodiments, the device further includes: a third nanostructure; a fourth nanostructure; a second gate dielectric layer around the third nanostructure and the fourth nanostructure; and a n-type work function tuning layer on the second gate dielectric layer, a second area between the third nanostructure and the fourth nanostructure being completely filled by the second gate dielectric layer and the n-type work function tuning layer. In some embodiments of the device, the second area between the third nanostructure and the fourth nanostructure is free of the dielectric barrier layer. In some embodiments of the device, a thickness of the n-type work function tuning layer in the second area is equal to a combined thickness of the first p-type work function tuning layer, the dielectric barrier layer, and the second p-type work function tuning layer in the first area. In some embodiments of the device, adjacent portions of the second p-type work function tuning layer in the first area share an interface.

In an embodiment, a method includes: depositing a first p-type work function tuning layer on a gate dielectric layer; depositing a protection layer on the first p-type work function tuning layer; annealing the first p-type work function tuning layer and the gate dielectric layer while the protection layer covers the first p-type work function tuning layer; after the annealing, removing at least a portion of the protection layer, a barrier layer being formed on the first p-type work function tuning layer during removal of the protection layer; and depositing a second p-type work function tuning layer on the barrier layer. In some embodiments of the method, the protection layer includes a material and the barrier layer includes an oxynitride of the material of the protection layer. In some embodiments of the method, the material of the protection layer is silicon and the first p-type work function tuning layer includes a metal nitride. In some embodiments of the method, removing the protection layer includes thinning the protection layer until a rate of the thinning is less than a target rate. In some embodiments of the method, removing the protection layer includes etching a material of the protection layer with an oxygen-containing etchant. In some embodiments of the method, the oxygen-containing etchant is a mixture of hydrogen peroxide and hydrogen chloride. In some embodiments of the method, the first p-type work function tuning layer is deposited to a first thickness, the second p-type work function tuning layer is deposited to a second thickness, the barrier layer is formed to a third thickness, and the third thickness is less than the first thickness and the second thickness. In some embodiments of the method, the second thickness is greater than the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a first nanostructure;
 a gate dielectric layer around the first nanostructure;
 a first p-type work function tuning layer on the gate dielectric layer;
 a dielectric barrier layer on the first p-type work function tuning layer, the dielectric barrier layer comprising silicon oxynitride; and
 a second p-type work function tuning layer on the dielectric barrier layer, the dielectric barrier layer being thinner than the first p-type work function tuning layer and the second p-type work function tuning layer.

2. The device of claim 1, wherein the second p-type work function tuning layer is thicker than the first p-type work function tuning layer.

3. The device of claim 1, wherein the first p-type work function tuning layer comprises a same p-type work function material as the second p-type work function tuning layer.

4. The device of claim 1, wherein the first p-type work function tuning layer comprises a different p-type work function material than the second p-type work function tuning layer.

5. The device of claim 1, wherein the first p-type work function tuning layer and the second p-type work function tuning layer each comprise a metal nitride.

6. The device of claim 1, wherein the dielectric barrier layer has a thickness of less than about 5 Å.

7. A device comprising:
- a first nanostructure;
- a second nanostructure;
- a first gate dielectric layer around the first nanostructure and the second nanostructure;
- a first p-type work function tuning layer on the first gate dielectric layer;
- a dielectric barrier layer on the first p-type work function tuning layer;
- a second p-type work function tuning layer on the dielectric barrier layer; and
- a fill layer on the second p-type work function tuning layer, a first area between the first nanostructure and the second nanostructure being completely filled by the first gate dielectric layer, the first p-type work function tuning layer, the dielectric barrier layer, and the second p-type work function tuning layer such that the first area is free of the fill layer.

8. The device of claim 7 further comprising:
- a third nanostructure;
- a fourth nanostructure;
- a second gate dielectric layer around the third nanostructure and the fourth nanostructure; and
- a n-type work function tuning layer on the second gate dielectric layer, a second area between the third nanostructure and the fourth nanostructure being completely filled by the second gate dielectric layer and the n-type work function tuning layer.

9. The device of claim 8, wherein the second area between the third nanostructure and the fourth nanostructure is free of the dielectric barrier layer.

10. The device of claim 8, wherein a thickness of the n-type work function tuning layer in the second area is equal to a combined thickness of the first p-type work function tuning layer, the dielectric barrier layer, and the second p-type work function tuning layer in the first area.

11. The device of claim 7, wherein adjacent portions of the second p-type work function tuning layer in the first area share an interface.

12. A method comprising:
- depositing a gate dielectric layer around a first nanostructure and a second nanostructure;
- depositing a first p-type work function tuning layer on the gate dielectric layer;
- depositing a protection layer on the first p-type work function tuning layer;
- annealing the first p-type work function tuning layer and the gate dielectric layer while the protection layer covers the first p-type work function tuning layer;
- after the annealing, removing at least a portion of the protection layer, a barrier layer being formed on the first p-type work function tuning layer during removal of the protection layer; and
- depositing a second p-type work function tuning layer on the barrier layer until the second p-type work function tuning layer merges together in an opening between the first nanostructure and the second nanostructure.

13. The method of claim 12, wherein the protection layer comprises a material and the barrier layer comprises an oxynitride of the material of the protection layer.

14. The method of claim 13, wherein the material of the protection layer is silicon and the first p-type work function tuning layer comprises a metal nitride.

15. The method of claim 12, wherein removing the protection layer comprises thinning the protection layer until a rate of the thinning is less than a target rate.

16. The method of claim 15, wherein removing the protection layer comprises etching a material of the protection layer with an oxygen-containing etchant.

17. The method of claim 16, wherein the oxygen-containing etchant is a mixture of hydrogen peroxide and hydrogen chloride.

18. The method of claim 12, wherein the first p-type work function tuning layer is deposited to a first thickness, the second p-type work function tuning layer is deposited to a second thickness, the barrier layer is formed to a third thickness, and the third thickness is greater less than the first thickness and the second thickness.

19. The method of claim 18, wherein the second thickness is greater than the first thickness.

20. The method of claim 12, wherein removing the at least the portion of the protection layer comprises etching the protection layer with a mixture of hydrogen peroxide and hydrogen chloride.

* * * * *